(12) United States Patent
Hirata et al.

(10) Patent No.: US 6,604,624 B2
(45) Date of Patent: Aug. 12, 2003

(54) WORK CONVEYING SYSTEM

(75) Inventors: Yasunari Hirata, Tokyo (JP); Takenori Hirakawa, Tokyo (JP); Akemichi Yamamoto, Tokyo (JP)

(73) Assignee: Hirata Corporation, Tokyo (JP)

( * ) Notice: Subject to any disclaimer, the term of this patent is extended or adjusted under 35 U.S.C. 154(b) by 0 days.

(21) Appl. No.: 10/259,515

(22) Filed: Sep. 30, 2002

(65) Prior Publication Data

US 2003/0029696 A1 Feb. 13, 2003

Related U.S. Application Data

(62) Division of application No. 09/639,068, filed on Aug. 16, 2000, now abandoned.

(30) Foreign Application Priority Data

Sep. 22, 1998 (JP) ............................................. 10-250836

(51) Int. Cl.[7] .............................................. B65G 45/00
(52) U.S. Cl. ................... 198/494; 198/750.11; 414/940
(58) Field of Search ...................... 414/222.07, 222.13, 414/225.01, 560, 561, 940; 901/8, 16; 15/303; 454/187; 198/468.2, 468.6, 494, 495, 750.11

(56) References Cited

U.S. PATENT DOCUMENTS

| | | | | |
|---|---|---|---|---|
| 4,821,866 A | * | 4/1989 | Melgaard | ..................... 198/494 |
| 4,836,111 A | | 6/1989 | Kaufmann | |
| 5,161,936 A | | 11/1992 | Kato | |
| 5,311,790 A | | 5/1994 | Yanagisawa | |
| 5,445,282 A | | 8/1995 | Erikkilä | |
| 5,510,993 A | | 4/1996 | Williams et al. | |
| 5,520,502 A | | 5/1996 | Liljengren et al. | |
| 5,570,990 A | | 11/1996 | Bonora et al. | |
| 5,605,432 A | | 2/1997 | Fink et al. | |
| 5,628,604 A | | 5/1997 | Murata et al. | |

FOREIGN PATENT DOCUMENTS

| | | |
|---|---|---|
| JP | 6-115617 | 4/1994 |
| JP | 9-312322 | 12/1997 |
| JP | 10-250835 | 9/1998 |

* cited by examiner

*Primary Examiner*—Joseph E. Valenza
(74) *Attorney, Agent, or Firm*—Burns, Doane, Swecker & Mathis, LLP

(57) ABSTRACT

A work conveying system for conveying works in a clean room includes a work holder for holding works, and a moving unit for moving the work holder.

5 Claims, 27 Drawing Sheets

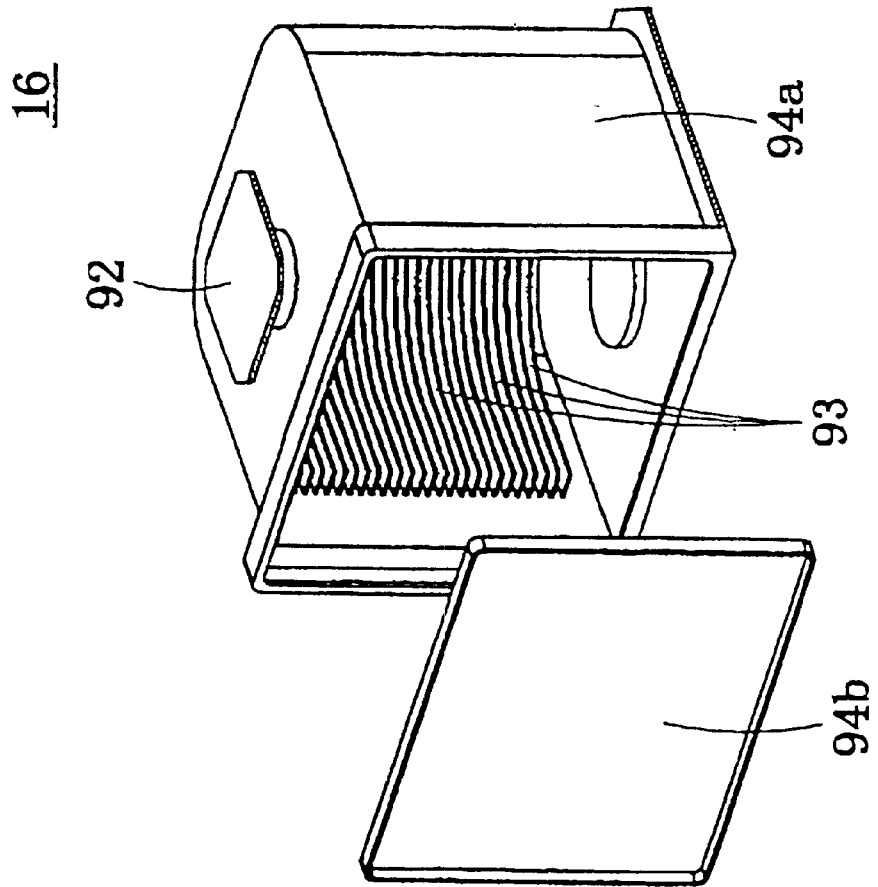

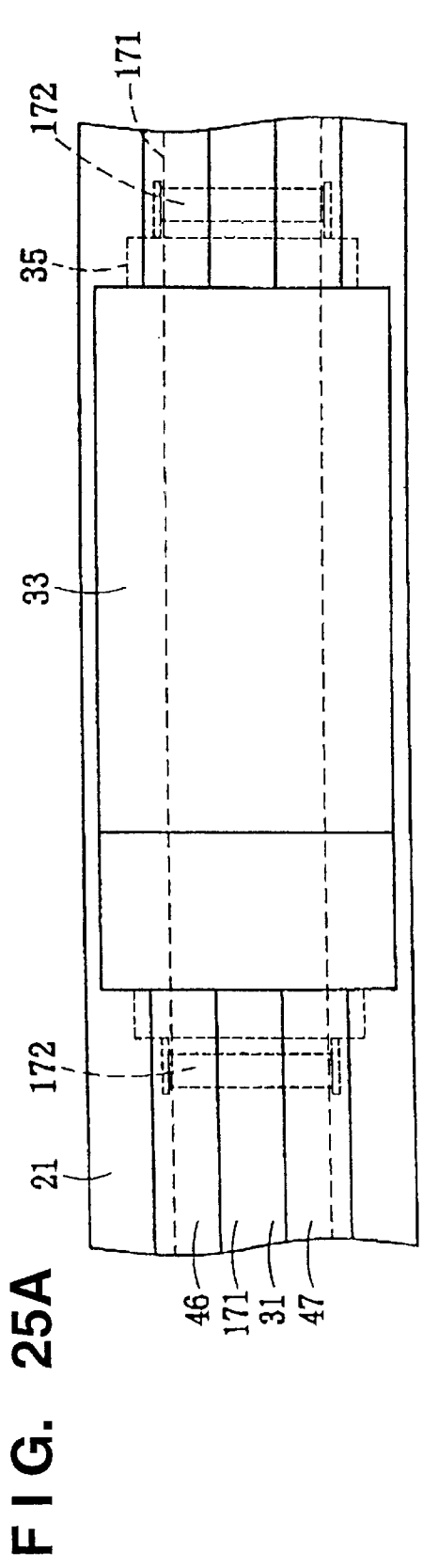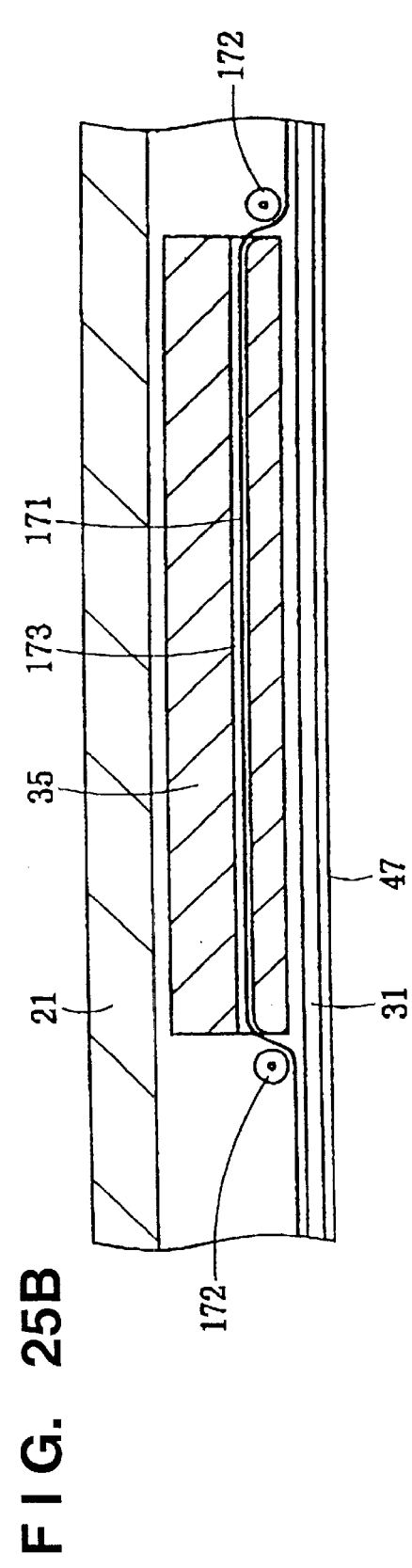
FIG. 25A
FIG. 25B

WORK CONVEYING SYSTEM

This application is a divisional of application Ser. No. 09/639,068, filed on Aug. 16, 2000 now abandoned.

FIELD OF THE INVENTION

The present invention relates to a work conveying apparatus for a clean room and, more particularly, to a work conveying system for transporting works between processing chambers in an intra-clean room production line for, e.g., semiconductor parts, liquid crystal display panels, medicines, chemicals, or processed food.

BACKGROUND OF THE INVENTION

The yield of semiconductor integrated circuits, liquid crystal display panels, and the like lowers by adhesion of dust. Also, medicines, chemicals, processed food, and the like are desirably produced in a germ-free, sanitary environment. For this purpose, intra-clean room production lines are operating in a wide variety of fields including such production departments. Various techniques have been developed for diverse processing chambers and conveying systems to be installed in a clean room.

(First Prior Art)

FIG. 1 is a perspective view showing an example of conventionally proposed intra-clean room production facilities. Reference numeral 1 denotes the floor surface of a clean room. In this clean room, a plurality of processing chambers 2 are arranged in order. An interface apparatus 3 for loading and unloading works into and from each processing chamber 2 is installed adjacent to each processing chamber 2. On the clean room floor surface 1, a guide path (track) 4 is laid down to pass in front of each interface apparatus 3. An automatic guided vehicle (AGV) 5 runs on the floor along this guide path 4.

In this clean room, works are conveyed from the interface apparatus 3 of one processing chamber 2 to the interface apparatus 3 of another processing chamber 2 by the automatic guided vehicle 5. Each interface apparatus (work loading/unloading apparatus) 3 shields the interior of the processing chamber 2 from the clean room. The works loaded into the processing chamber 2 by the interface apparatus 3 are subjected to predetermined processing meeting the purpose of the processing chamber 2. The works processed in the processing chamber 2 are extracted from the processing chamber 2 by the interface apparatus 3 and loaded onto the automatic guided vehicle 5. The works thus completely processed in one processing chamber 2 are transported to the next processing chamber 2, loaded into this processing chamber 2 by the interface apparatus 3, and subjected to predetermined processing. In this manner, works are sequentially subjected to predetermined processing in the clean room.

When a work conveying system with this arrangement is used, however, it is necessary to secure in the clean room a sufficiently wide transfer area capable of allowing the automatic guided vehicle 5 to safely run without colliding against the processing chambers 2, the interface apparatuses 3, or maintenance workers, in addition to the installation area of the processing chambers 2 and the interface apparatuses 3. In other words, to allow continuous operation by reducing the rate of inconveniences in the intra-clean room production line, maintenance of diverse apparatuses such as the processing chambers 2 and the interface apparatuses 3 is necessary. Therefore, a sufficient area is required to permit safe maintenance with no collisions against the automatic guided vehicle 5.

For this reason, a clean room using the work conveying system as shown in FIG. 1 occupies a large area on the floor. This increases the installation cost and operation cost per unit volume of the clean room, resulting in a very expensive clean room as a whole.

(Second Prior Art)

FIG. 2 is a perspective view showing another conventional installation in a clean room. This intra-clean room installation uses an overhead type automatic guided vehicle 7. That is, an overhead rail 6 is laid below the ceiling of the clean room, and the monorail type automatic guided vehicle 7 runs along this overhead rail 6. This automatic guided vehicle 7 runs above each interface apparatus 3 along its front surface.

In this intra-clean room installation, the automatic guided vehicle 7 passes at a level above a floor surface 1, which is much higher than human heights. Hence, the possibility of collisions between this automatic guided vehicle 7 and maintenance workers and the like is zero. Accordingly, an area below the space in which the automatic guided vehicle 7 runs can be used to perform, e.g., maintenance of processing chambers 2 and inspection of works. Consequently, the floor area of the clean room can be reduced, and this can reduce the installation cost and operation cost of the clean room. This type of clean room is disclosed in, e.g., Japanese Patent Laid-Open No. 9-312322.

(Third Prior Art)

Japanese Patent Laid-Open No. 10-250836 has disclosed a system in which an automatic guided vehicle disposed in the upper space of a clean room runs above interface apparatuses. With this arrangement, it is necessary to secure only a maintenance area for performing maintenance between processing chambers each having the interface apparatus. A floor area occupied by the maintenance area is smaller than that of the area for running the automatic guided vehicle. Therefore, when the automatic guided vehicle runs above the interface apparatuses and it is only necessary to secure the maintenance area between the individual processing chambers, the necessary floor area can be smaller than the intra-clean room installation shown in FIG. 2. This can further reduce the cost of the clean room.

Unfortunately, the transfer path is fixed in any of the work conveying systems used in the conventional intra-clean room facilities as described above. When the transfer path of the work conveying system is thus fixed, the installation positions of the processing chambers and interface apparatuses are limited by this transfer path. So, it is not necessarily possible to optimally arrange the processing chambers and interface apparatuses in the clean room. That is, the interface apparatus adjacent to the processing chamber must be installed immediately below, or in the vicinity of, the transfer path installed in the clean room. Also, the position and direction of the processing camber depend on the position of the interface apparatus, i.e., they cannot be freely changed. Even when a new processing chamber is to be added, the arrangement of individual processing chambers and their interface apparatuses cannot be freely designed, so the installation positions may be unavoidably changed. Especially in an expensive clean room, the space cannot be given any margin from the beginning. This makes designing the installation positions more and more difficult.

In the fields of semiconductor devices and liquid crystal display panels, the lifecycles of products shorten year by year by the advent of new methods and new structures. Hence, the factory installations must be refined frequently. This factory installation refinement is desirably performed at minimum cost. In practice, however, the existing work conveying system restricts the installation positions of interface apparatuses. Therefore, considerable limitations are still imposed on replacement, change of the arrangement, and addition of processing chambers or interface apparatuses when the process is changed, and the cost increases accordingly.

SUMMARY OF THE INVENTION

The present invention has been made to solve the above technical problems, and has as its object to provide a clean room work conveying system capable of reducing limitations on the installation positions of apparatuses in a clean room, and allowing effective use of the space in the clean room.

According to the present invention, there is provided a work conveying system for conveying works in a clean room, comprising a work holder for holding works, and moving means for moving the work holder.

In the work conveying system of the present invention, the moving means desirably moves the work holder in an arbitrary three-dimensional direction in a space above the floor of the clean room.

Since the work holder for holding and conveying works moves in the upper space of the clean room, no area is necessary for work transfer on the floor of the clean room. This makes effective use of the clean room feasible. Accordingly, a necessary clean room volume can be decreased for the same installation. This can reduce the installation cost and operation cost of the clean room.

Also, the moving means can move the work holder in an arbitrary three-dimensional direction. Therefore, the installation positions and installation directions of apparatuses such as processing chambers installed in the clean room are not easily limited, so an optimum arrangement can be selected. Additionally, when a new processing chamber or the like is to be added or when the arrangement of apparatuses such as processing chambers is to be changed, the arrangement or installation directions can be freely chosen. Hence, it is possible to reduce the cost for changing the arrangement of apparatuses such as processing chambers or for adding a new apparatus.

Furthermore, when the work holder is moved above apparatuses such as the processing chambers, this work holder can be moved straight from one position to another. This improves the processing efficiency in the clean room.

In the work conveying system of the present invention, the moving means desirably moves the work holder in an arbitrary direction in a substantially horizontal plane in a space above the floor of the clean room, and the work conveying system desirably further comprises work lifting means added to an apparatus installed in the clean room to load/unload works with respect to the work holder and move works up and down.

In this system, the work holder for holding works horizontally moves in the upper space of the clean room, and the work lifting means of an apparatus such as a processing chamber moves up to the height of the work holder and loads/unloads works with respect to the work holder. This obviates an area for work transfer on the floor of the clean room and makes effective use of the clean room possible. Accordingly, a necessary clean room volume can be decreased for the same installation. This can reduce the installation cost and operation cost of the clean room.

Also, the moving means can move the work holder in an arbitrary three-dimensional direction. Therefore, the installation positions and installation directions of apparatuses such as processing chambers installed in the clean room are rarely limited, so an optimum arrangement can be selected. Additionally, when a new processing chamber or the like is to be added or when the arrangement of apparatuses such as processing chambers is to be changed, the arrangement or installation directions can be freely chosen. Hence, it is possible to reduce the cost for changing the arrangement of apparatuses such as processing chambers or for adding a new apparatus.

Since the moving means does not require any function of moving the work holder up and down, the installation space height of the moving means can be decreased. This can further reduce the installation cost and operation cost of the clean room.

Furthermore, the work holder can load/unload works with respect to the work lifting means only by horizontal movement and can immediately proceed on to an operation for another work transfer while allowing the work lifting means to raise or lower the works. This can increase the speed of work transfer.

The apparatus installed in the clean room can comprise a plurality of work loading/unloading units, and the work lifting means can move along these work loading/unloading units.

In this case, in order to improve the operation efficiency, the work lifting means can move along the work loading/unloading units with respect to the apparatus such as a processing chamber including these work loading/unloading units. Therefore, the work lifting means which has received works can move to and load/unload the works with respect to a work loading/unloading unit capable of receiving works. Additionally, the number of the work loading/unloading means is smaller than the number of the work loading/unloading units, so the cost decreases.

Also, in the work conveying system of the present invention, the moving means desirably moves the work holder in an arbitrary direction in a substantially horizontal plane at a height substantially equal to the work loading/unloading height of an apparatus installed in the clean room.

In this system, the work holder for holding works horizontally moves in the upper space of the clean room, and the work lifting means of an apparatus such as a processing chamber moves up to the height of the work holder and loads/unloads works with respect to the work holder. This obviates an area for work transfer on the floor of the clean room and makes effective use of the clean room possible. Accordingly, a necessary clean room volume can be decreased for the same installation. This can reduce the installation cost and operation cost of the clean room.

Also, the moving means can move the work holder in an arbitrary three-dimensional direction. Therefore, the installation positions and installation directions of apparatuses such as processing chambers installed in the clean room are rarely limited, so an optimum arrangement can be selected. Additionally, when a new processing chamber or the like is to be added or when the arrangement of apparatuses such as processing chambers is to be changed, the arrangement or installation directions can be freely chosen. Hence, it is possible to reduce the cost for changing the arrangement of apparatuses such as processing chambers or for adding a new apparatus.

Since the moving means does not have any function of moving the work holder up and down, the installation space height of the moving means can be decreased. This can further reduce the installation cost and operation cost of the clean room.

Furthermore, in this work conveying system, the work holder does not perform any lifting operation. This can increase the speed of work transfer.

The work conveying system of the present invention desirably further comprises a controller for automatically selecting, on the basis of input information, a path along which the moving means moves the work holder.

As the input information, process content information and arrangement information of apparatuses such as processing chambers are input. On the basis of these pieces of information and various pieces of previously input information about, e.g., work transfer and disturbance of air in the clean room, the controller automatically selects a transfer path in accordance with a predetermined algorithm. This allows work transfer which minimizes disturbance of the cleanliness in the clean room.

In the work conveying system of the present invention, works are desirably sealed in a container, and the container is desirably held by the work holder and conveyed by the moving means.

Since works are conveyed as they are sealed in the container, a necessary level of the cleanliness in the clean room can be lowered by raising the cleanliness in the container. Consequently, the installation cost and operation cost of the clean room can be reduced.

In the work conveying system of the present invention, the moving means is desirably capable of moving works from one apparatus to another installed in the clean room via a work standby place for temporarily stocking works.

In this case, works can be conveyed from one apparatus to another installed in the clean room via the work standby place. Hence, if an apparatus as the transfer destination is processing other works, another work transfer can be performed while the works to be conveyed are temporarily stocked in the work standby place. This can improve the operation efficiency of work processing.

In the work conveying system of the present invention, the moving means desirably comprises a second member which moves with respect to a first member, and non-contact power supply means desirably supplies electric power from the first member to the second member.

In this system, the non-contact power supply means supplies electric power in a movable portion between the members. Therefore, no dust is produced by sliding in the power supply portion, so the cleanliness in the clean room does not lower.

In the work conveying system of the present invention, the moving means desirably comprises a second member which moves with respect to a first member, and the second member desirably runs with respect to the first member by a linear motor.

In this system, the movable member (second member) is moved by the linear motor in a movable portion between the members. Since this linear motor uses magnetic repulsive force, the second member can be moved as it is floated from the first member. Accordingly, no dust is produced in the movable portion of the moving means, so the cleanliness in the clean room does not lower.

In the work conveying system of the present invention, the moving means desirably comprises a portion in which a slider of a second member is accommodated, so as to be able to freely run, in a traveling space formed in a first member, and a gap between a connecting member extending from the slider to the outside of the first member and the first member desirably bends.

In this system, the gap between the connecting member extending from the slider housed in the first member to the outside of the first member and the first member bends. Hence, dust produced in the contact portion between the first member and the slider is not easily discharged outside the first member through the gap, so the clean room is not easily contaminated. Also, since the slider which can freely run is accommodated in the first member, dust produced by contact is not released outside the first member while the slider is running.

In the work conveying system of the present invention, the moving means desirably comprises exhausting means for exhausting air inside the moving means to the outside of the clean room.

Since the moving means includes the exhausting means for exhausting air inside the moving means to the outside of the clean room, dust produced inside the moving means, particularly in movable portions can be forcedly discharged to the outside of the clean room. Therefore, the cleanliness of the clean room does not easily lower by the work conveying system.

In this system, the moving means can have a substantially closed structure as a whole, and portions of the moving means can communicate with each other.

Since the moving means has a substantially closed structure as a whole and portions of this moving means communicate with each other, dust produced inside the moving means can be forcedly discharged outside the clean room, with no leakage to the clean room, by the exhausting means.

In the work conveying system of the present invention, the work holder can comprise a conveyor for loading and unloading works.

In this system, the work holder includes the conveyor for loading and unloading works. Accordingly, this conveyor of the work holder can load/unload works with respect to an apparatus such as an interface apparatus. This makes smooth work loading/unloading possible.

In the work conveying system of the present invention, the work holder desirably comprises a sensor for sensing contact with an apparatus installed in the clean room.

In this system, the work holder includes the sensor for sensing contact with an apparatus installed in the clean room. Therefore, if this work holder comes in contact with another apparatus such as a processing chamber or an interface apparatus, the sensor can sense this contact and stop the work holder or make the work holder detour. This can prevent the work holder from colliding against another apparatus to result in serious damage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

in FIG. 4;

FIG. 14 is a perspective view of a closed container whose airtight door is open;

FIG. 25A is a front view showing the structures of a fixed guide rail and a traveling unit used in a work conveying system according to still another embodiment of the present invention;

FIG. 25B is a sectional view showing the fixed guide rail from which the internal structure of a slider is omitted;

DETAILED DESCRIPTION OF THE PREFERRED EMBODIMENTS (First Embodiment)

Figure 1:
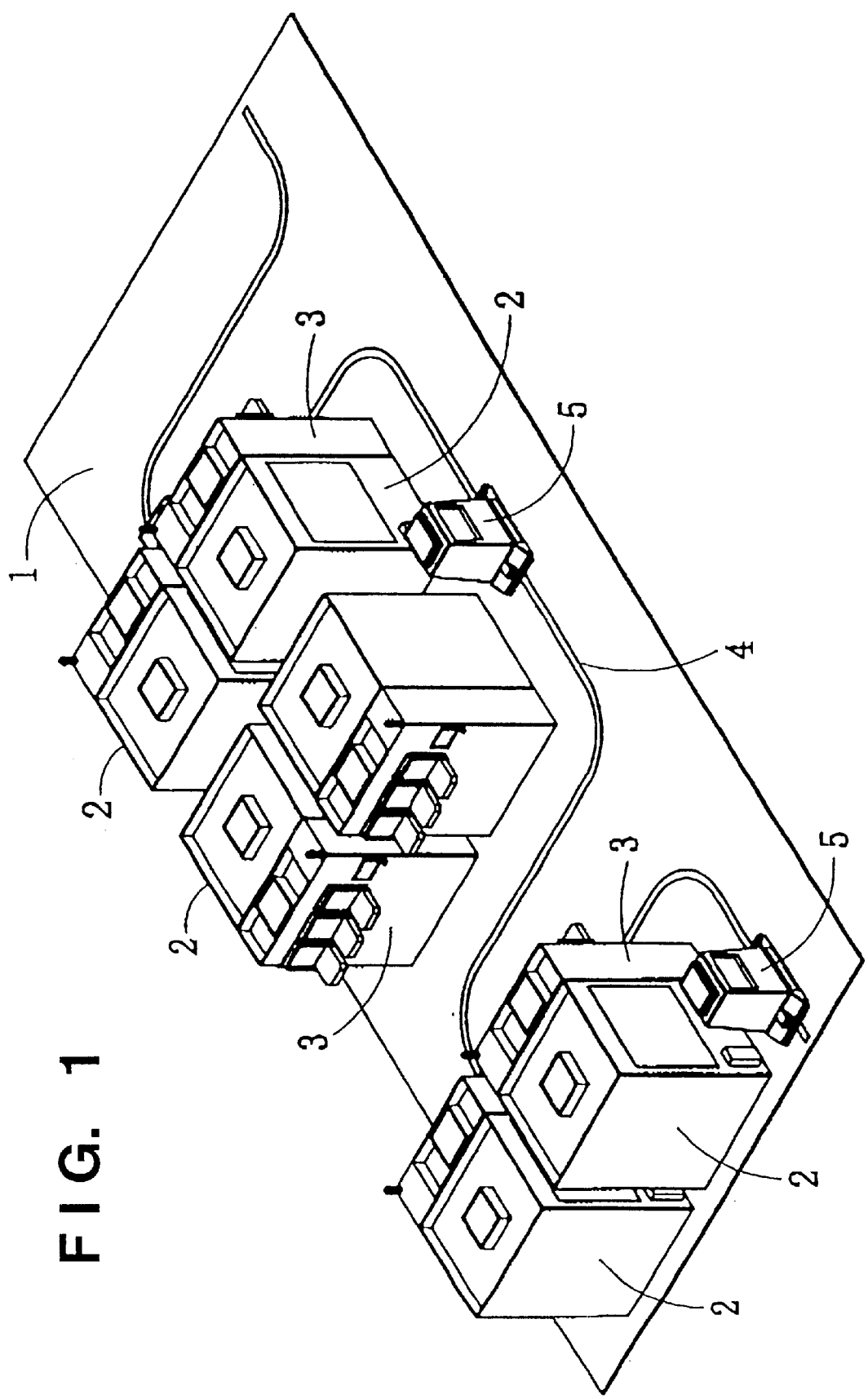
FIG. 1 is a perspective view showing a conventional clean room work conveying system.
Figure 2:
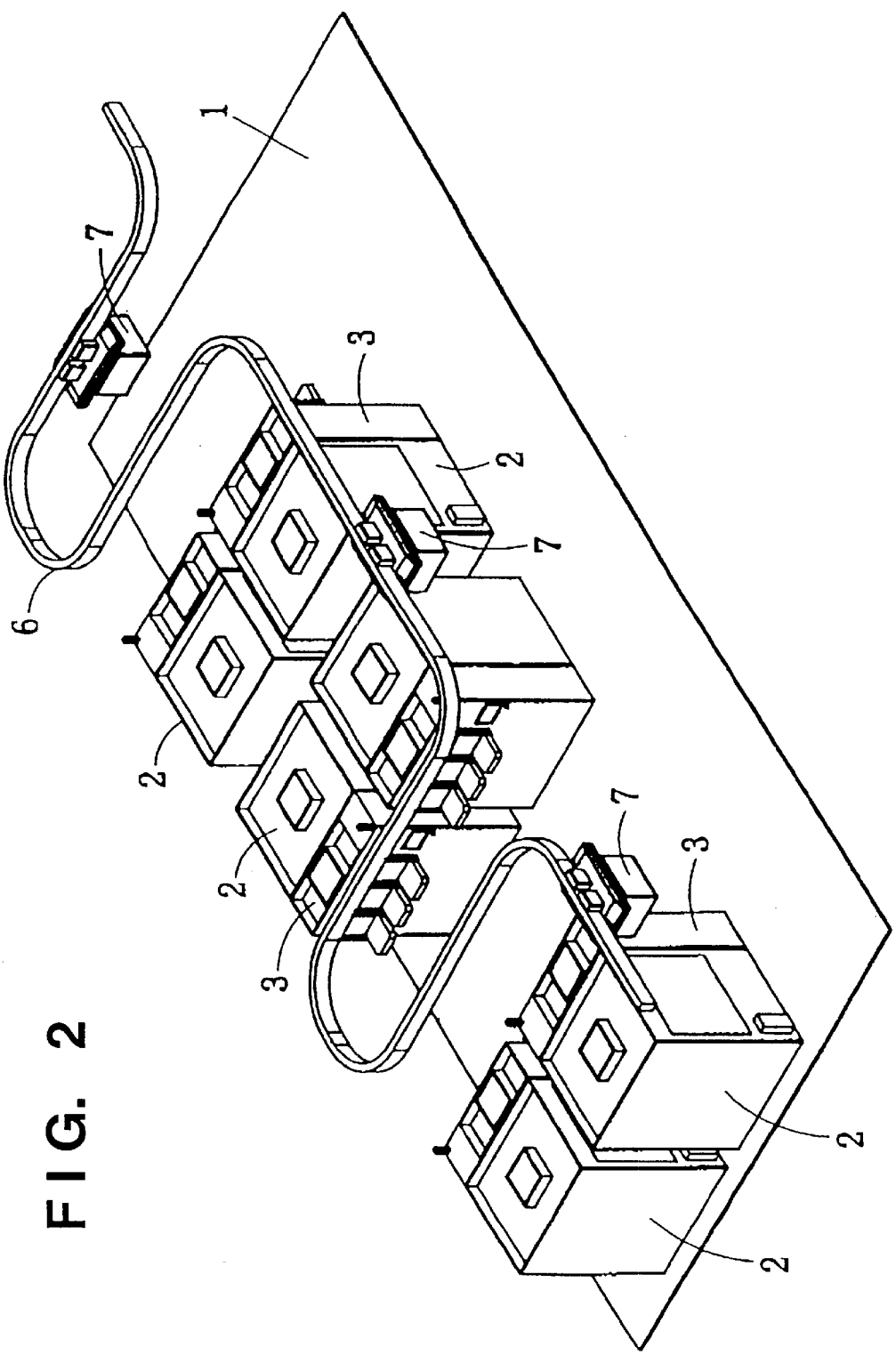
FIG. 2 is a perspective view showing another conventional clean room work conveying system.
Figure 3:
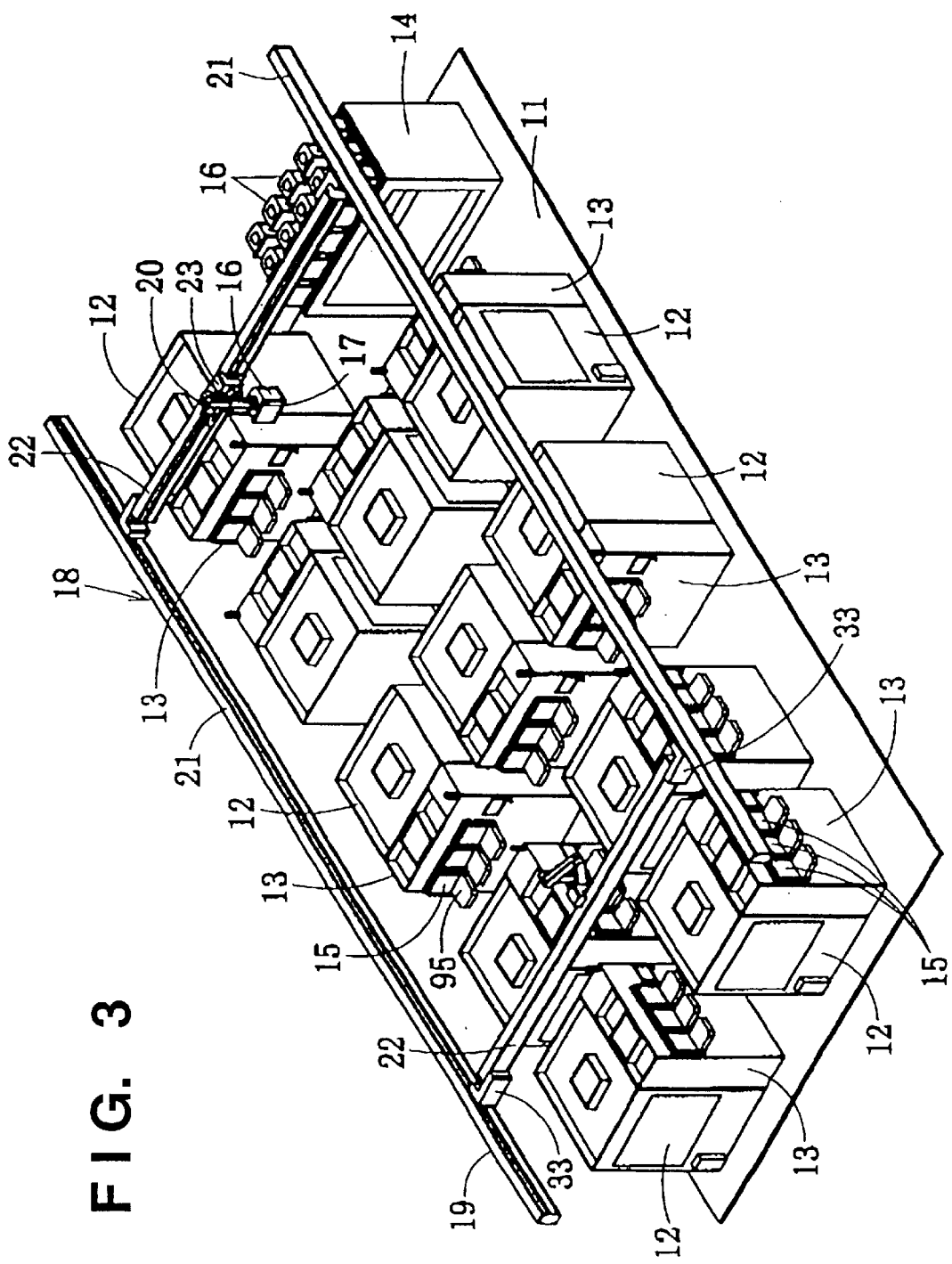
FIG. 3 is a perspective view showing the interior of a clean room including a work conveying system according one embodiment of the present invention.

FIG. 3 is a perspective view showing the entire interior of a clean room using a work conveying system according to the first embodiment of the present invention. A plurality of processing chambers 12 and a work standby station 14 are installed on a floor 11 of the clean room, and an interface apparatus 13 is added to each processing chamber 12. These processing chambers 12 are facilities for sequentially manufacturing works and perform different processes. However, a plurality of identical processing chambers can also be included by taking account of the tact time balance of work processing. For example, the processing chambers 12 are of semiconductor wafer processing apparatus for performing resist coating, exposure, development, ion implantation, annealing, and sputtering for semiconductor wafers. Therefore, the following explanation will be made by taking processing for semiconductor wafers into consideration. The interface apparatus 13 forms a buffer space for shielding the interior of each processing chamber 12 from the clean room. This interface apparatus 13 executes loading/unloading of works in each processing chamber 12. Work loading/unloading ports 15 of the interface apparatus 13 are closed except when works are loaded or unloaded.

The processing chambers 12 and the interface apparatuses 13 are arranged in order with a minimum maintenance area for permitting maintenance workers and operators to work between them. This minimizes the floor area of the clean room and makes the most of the clean room. However, these processing chambers 12 need not be arranged in line, and the direction of their front surfaces (the surfaces facing the interface apparatuses 13) is not defined. That is, the processing chambers 12 can be arranged at random to some extent.

In the upper space of this clean room, a work conveying system for conveying a closed container 16 containing works to the processing chambers 12 in accordance with the processing order is installed. To specifically maintain the degree of cleanliness, works are conveyed as they are sealed in the closed container 16. This transfer system for conveying works comprises a work holder 17 for holding the closed container 16 containing works and a three-dimensional moving mechanism 18 capable of moving the work holder 17 in an arbitrary direction in a three-dimensional space. The three-dimensional moving mechanism 18 includes a horizontal moving mechanism 19 for moving the work holder 17 in a substantially horizontal plane and a work lifter 20 for vertically moving the work holder 17.

In this embodiment, as shown in FIG. 3, a pair of horizontal fixed guide rails 21 are disposed parallel in a space higher than the processing chambers 12 in the clean room. In addition, one or a plurality of horizontal traveling guide rails 22 are extended between the fixed guide rails 21. These traveling guide rails 22 can travel along the fixed guide rails 21. Each traveling guide rail 22 has a traveling member 23 which travels along the traveling guide rail 22. This traveling member 23 has the work lifter 20 capable of vertically moving the work holder 17. The fixed guide rails 21, the traveling guide rails 22, and the traveling members 23 constitute the horizontal moving mechanism 19. This horizontal moving mechanism 19 plus the work lifter 20 constitute the three-dimensional moving mechanism 18.

The structure of the above work conveying system will be described in detail below. In the upper space of the clean room, the fixed guide rails 21 are installed near the wall surfaces on the two opposing sides. Each fixed guide rail 21 is suspended from the ceiling of the clean room or supported by pillars extended from the floor 11 of the clean room. The section of this fixed guide rail 21 is shown in FIGS. 5 to 8. As this fixed guide rail 21, a hollow aluminum frame drawn member having a substantially C-shaped section is used. A side opening 31 extending over the whole length is formed in one side surface of the fixed guide rail 21. A power-supply rail 32 for supplying electric power is disposed on the inner surface of the other side over the entire length of the fixed guide rail 21. This power-supply rail 32 is connected to a commercial power supply at the end portion of the fixed guide rail 21.

Figure 4:
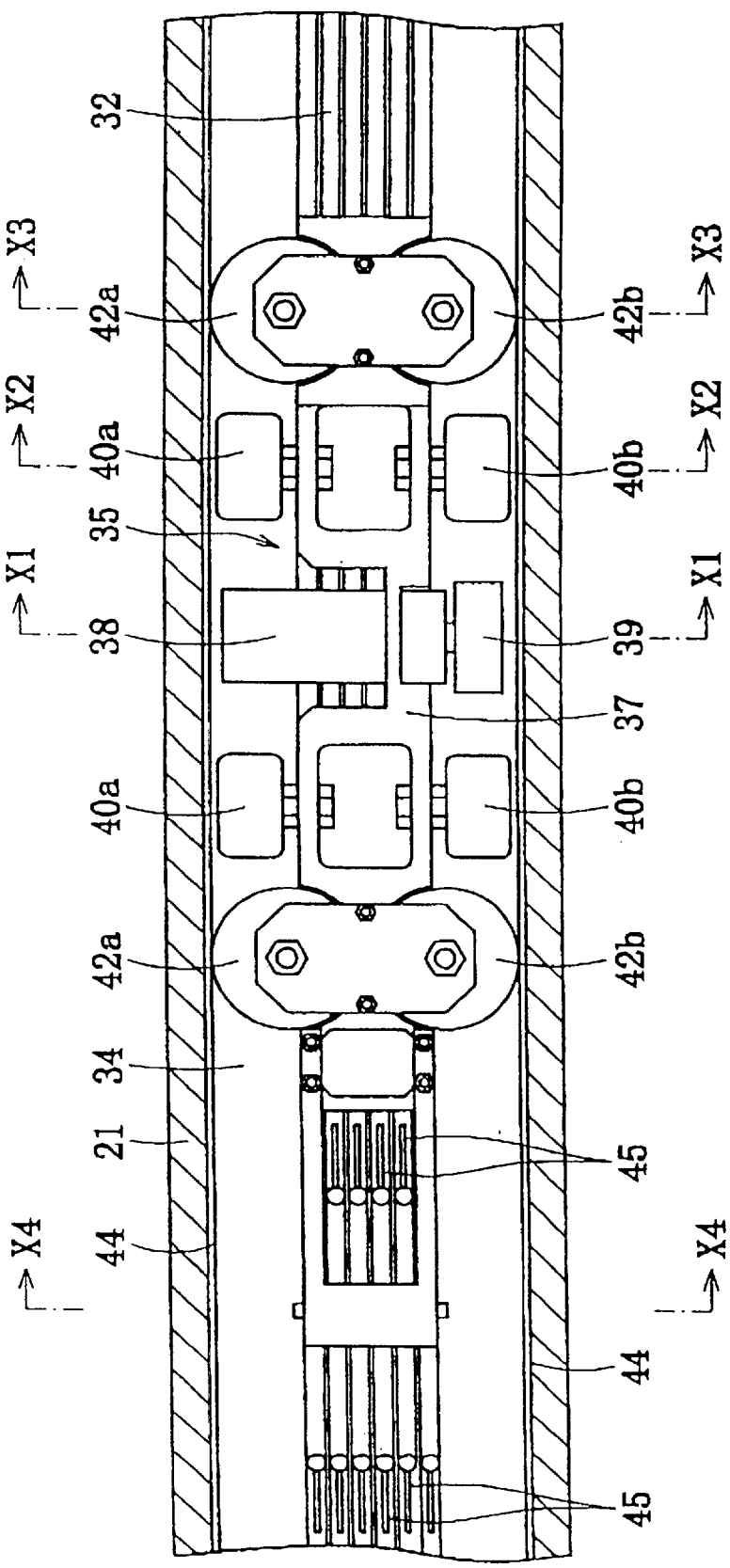
FIG. 4 is a longitudinal sectional view showing the structure of a traveling unit accommodated in a fixed guide rail.

FIG. 4 is a sectional view showing a traveling unit 33 connected to the fixed guide rail 21. FIGS. 5, 6, 7, and 8 are sectional views taken along lines X1—X1, X2—X2, X3—X3, and X4—X4, respectively, in FIG. 4. The traveling guide rail 22 includes the traveling units 33 at the two ends. This traveling guide rail 22 is extended between the fixed guide rails 21 by connecting the traveling units 33 to the fixed guide rails 21 such that the traveling units 33 can freely run. Each traveling unit 33 comprises a slider 35 accommodated in a traveling space 34 of the fixed guide rail 21, and a connecting member 36 for connecting the slider 35 and the end portion of the traveling guide rail 22.

Figure 5:
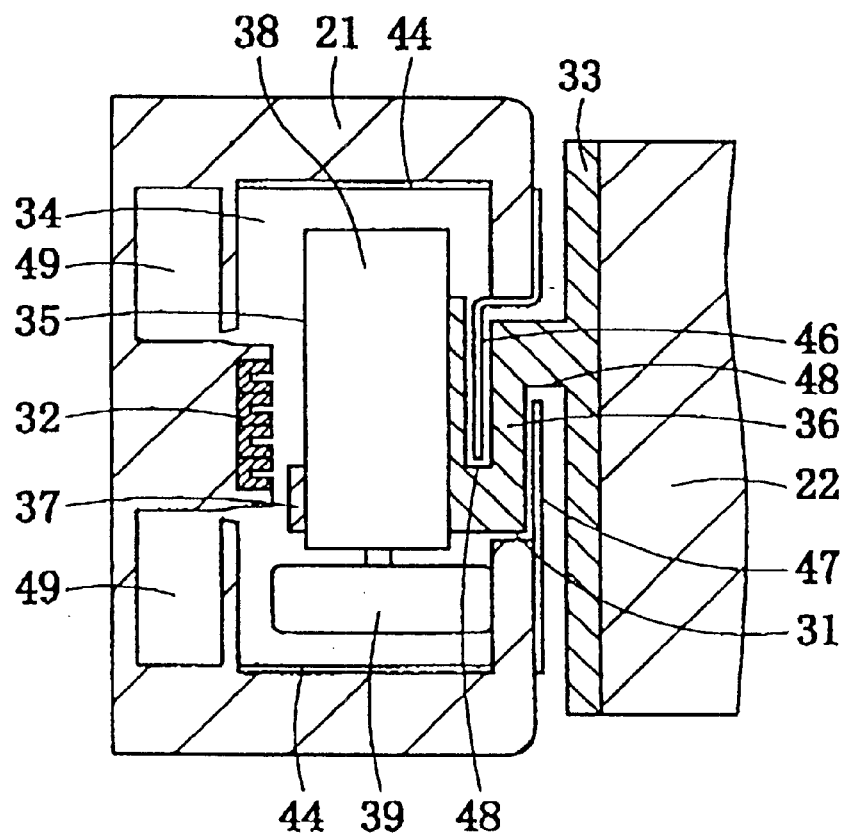
FIG. 5 is a sectional view taken along a line X1—X1 in FIG. 4.

In the slider 35 housed in the fixed guide rail 21, a driving motor 38 such as a servo motor or pulse step motor is mounted on a substantially central portion of a slider main body 37. A driving roller 39 is attached to an output shaft of this motor 38. As shown in FIG. 5, the outer surface of the driving roller 39 is in tight contact with the inner side surface of the fixed guide rail 21 in a portion below the side opening 31.

Figure 6:
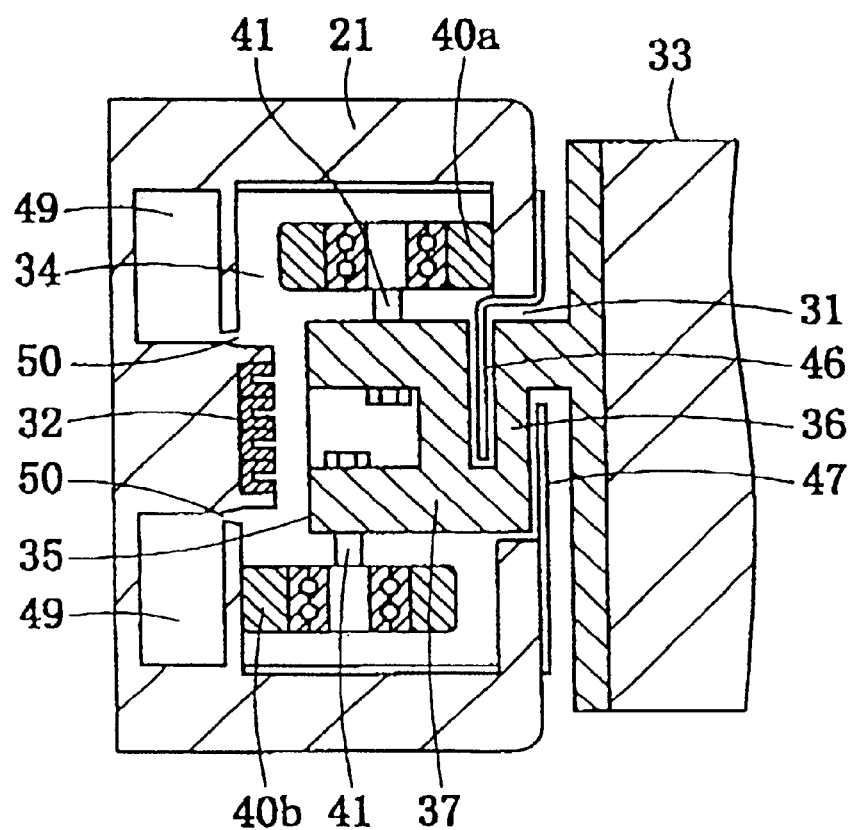
FIG. 6 is a sectional view taken along a line X2—X2 in FIG. 4.

Horizontal driven rollers 40a and 40b each having a bearing are placed in symmetrical positions about the motor 38 of the slider main body 37. As shown in FIG. 6, these horizontal driven rollers 40a and 40b are pivotally, axially supported by shafts 41 at the upper and lower surfaces, respectively, of the slider main body 37. The horizontal driven roller 40a at the upper surface of the slider main body 37 is in tight contact with the inner side surface of the fixed guide rail 21 in a portion above the side opening 31. The horizontal driven roller 40b at the lower surface of the slider main body 37 is in tight contact with the inner side surface opposite to the side opening 31. As described above, the upper horizontal driven roller 40a is in contact with the inner side surface of the fixed guide rail 21 on the side of the side opening 31, and the lower horizontal driven roller 40b is in contact with the inner side surface of the fixed guide rail 21 on the side opposite to the side opening 31. This is to receive the angular moment generated in the slider 35 by the weights of the connecting member 36 and the traveling guide rail 22 when the connecting member 36 and the traveling guide rail 22 are connected to the side surface of the slider 35 on the side of the side opening 31. Also, since the lower horizontal driven roller 40b is brought into tight contact with the fixed guide rail 21 on the side opposite to the side opening 31, the resulting counter-force brings the upper horizontal driven roller 40a and the driving roller 39 into tight contact with the fixed guide rail 21 on the side of the side opening 31. Consequently, it is possible to obtain the driving force by the driving roller 39 and allow the slider 35 to smoothly run with no play in the horizontal direction.

Figure 7:
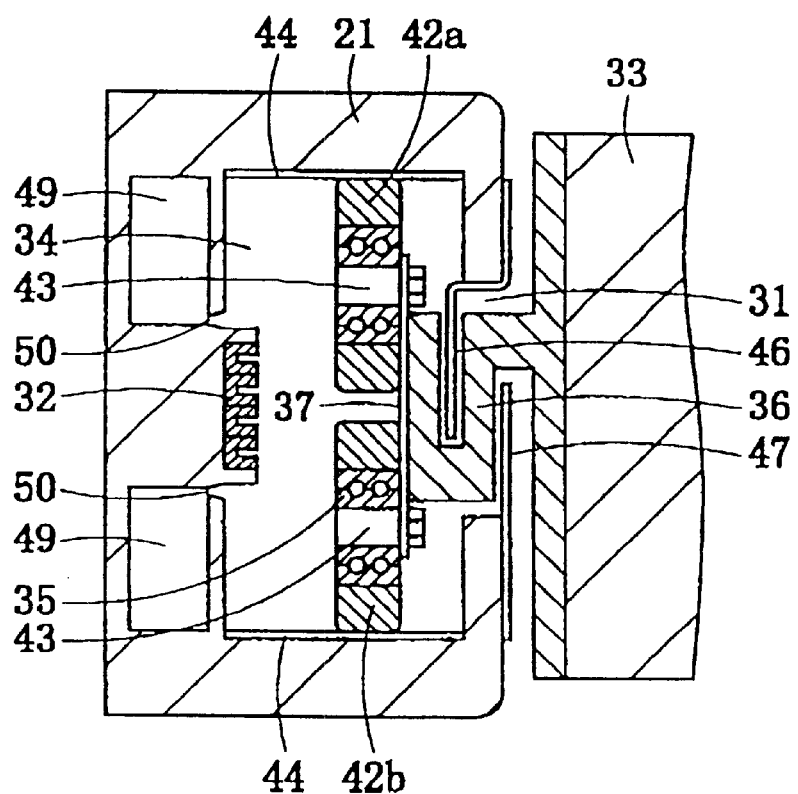
FIG. 7 is a sectional view taken along a line X3—X3 in FIG. 4.

Vertical driven rollers 42a and 42b each having a bearing are placed at symmetrical positions about the motor 38 of the slider main body 37. As shown in FIG. 7, these vertical driven rollers 42a and 42b are pivotally, axially supported by shafts 43 in the upper and lower portions, respectively, of the slider main body 37. The vertical driven roller 42a in the upper portion of the slider main body 37 is in tight contact with the ceiling surface of the fixed guide rail 21. The vertical driven roller 42b in the lower portion of the slider main body 37 is in tight contact with the bottom surface of the fixed guide rail 21. Since the vertical driven rollers 42a and 42b are thus brought into tight contact with the ceiling and bottom surfaces of the fixed guide rail 21, the slider 35 can smoothly run with no play in the vertical direction. Thin travel plates 44 are disposed over the entire length on the ceiling and bottom surfaces of the fixed guide rail 21 on which the vertical driven rollers 42a and 42b run in contact with them. These travel plates 44 prevent wear of the fixed guide rail 21 and, if the travel plates 44 wear, only the travel plates 44 can be replaced with ease.

Also, since the vertical driven rollers 42a and 42b are placed on the two sides of the motor 38, it is possible to receive the angular moment generated around the axis of the traveling guide rail 22 by the work lifter 20.

Figure 8:
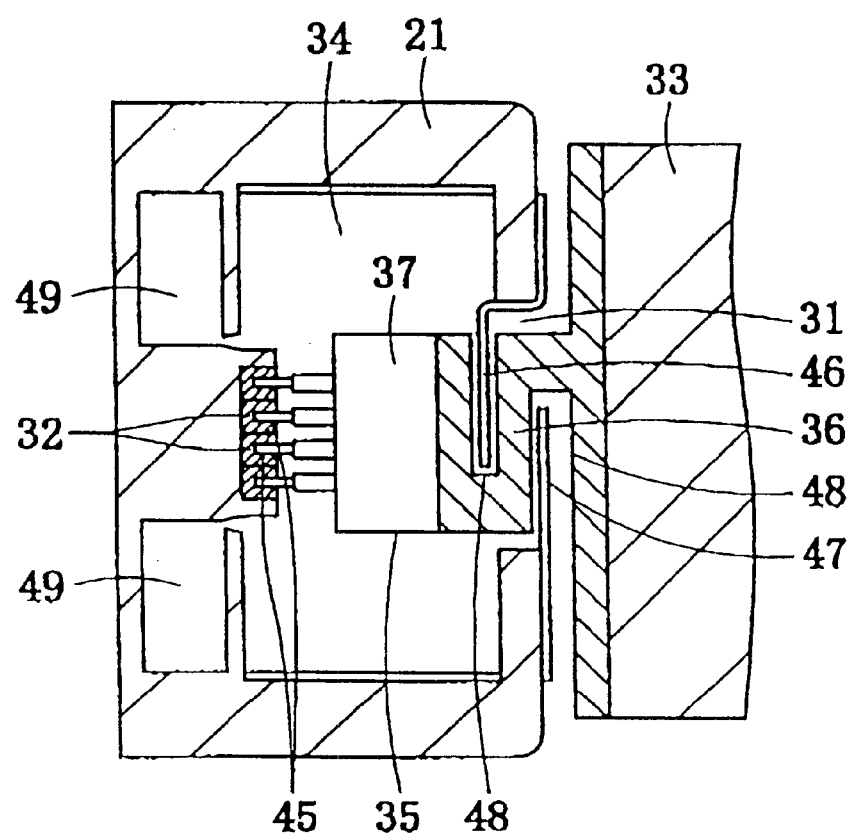
FIG. 8 is a sectional view taken along a line X4—X4.

Collectors (brushes) 45 are formed at the end portion of the slider main body 37. As shown in FIG. 8, these collectors 45 are in slidable contact with the power-supply rail 32 on the inner surface of the fixed guide rail 21. The motor 38 mounted on the slider main body 37 receives electric power via the power-supply rail 32 and the collectors 45 and rotates the driving roller 39, thereby running the slider 35 in the fixed guide rail 21.

The electric power which the collectors 45 receive from the power-supply rail 32 is supplied to the motor 38 through a cable (not shown). The motor 38 can be ON/OFF-controlled using a radio communicating means or an optical communicating means. Alternatively, the power-supply rail 32 or some of the collectors 45 can be used to transmit a control signal to the motor 38.

The connecting member 36 for connecting the slider 35 and the traveling guide rail 22 is connected to the slider 35 in the fixed guide rail 21 through the side opening 31 of the fixed guide rail 21. The connecting member 36 is connected to the end portion of the traveling guide rail 22 outside the fixed guide rail 21. As shown in FIGS. 5 to 8, this connecting member 36 has a zigzagged (mazy) sectional shape. In the vicinity of the side opening 31 of the fixed guide rail 21, two thin shielding plates 46 and 47 are attached over the entire length of the fixed guide rail 21 by machine screws or the like. These shielding plates 46 and 47 are inserted deep into trenches (slits) 48 of the connecting member 36. The two shielding plates 46 and 47 are attached to the two sides of the side opening 31 such that these shielding plates 46 and 47 overlap each other when viewed in a direction perpendicular to the side opening 31. Accordingly, the side opening 31 of the fixed guide rail 21 is covered with these shielding plates 46 and 47.

As described above, the traveling units 33 at the two end portions of the traveling guide rail 22 run along the fixed guide rail 21. Since the slider 35 as a movable portion of each traveling unit 33 is accommodated in the traveling space 34 of the fixed guide rail 21, dust from this movable portion (slider 35) is not easily released to the outside of the fixed guide rail 21. In addition, the side opening 31 of the fixed guide rail 21 is covered with the shielding plates 46 and 47. This makes the release of dust to the outside of the fixed guide rail 21 more difficult. Furthermore, the gaps between the connecting member 36, the fixed guide rail 21, and the shielding plates 46 and 47 are zigzagged. Hence, dust produced by contact between the driving roller 39, the horizontal driven rollers 40a and 40b, the vertical driven rollers 42a and 42b, and the fixed guide rail 21 does not easily leak to the outside through the gaps between the connecting member 36 and the fixed guide rail 21. Accordingly, it is possible to minimize contamination in the clean room caused by dust produced in the fixed guide rail 21.

Also, in the fixed guide rail 21, two suction through passages 49 for drawing dust by suction are formed adjacent to the traveling space 34 housing the slider 35 over the whole length of the fixed guide rail 21. Between the two suction through passages 49 and the traveling space 34, slit-like or hole-like dust collecting openings 50 are formed over the entire length of the fixed guide rail 21 or at predetermined intervals. The suction through passages 49 and the traveling space 34 communicate with each other through these dust collecting openings 50. At one or two end portions of the fixed guide rail 21, the suction through passages 49 are connected to a suction device such as a vacuum pump installed outside the clean room via a hose (not shown). The other end portion of the fixed guide rail 21 is closed with a cap or the like. Dust produced in the traveling space 34 is drawn by suction into the suction through passages 49 through the dust collecting openings 50 and discharged to the outside of the clean room.

Although dust produced in the fixed guide rail 21 is confined in the fixed guide rail 21 as described above, the dust density in the fixed guide rail 21 gradually increases as the work conveying system is operated, and the slider 35 running in the fixed guide rail 21 scatters the dust. Therefore, the suction through passages 49 are formed in the fixed guide rail 21 to perform air forced suction from the end portions of these suction through passages 49. As a consequence, the dust confined in the fixed guide rail 21 can be drawn to the suction through passages 49 by suction and discharged to the outside of the clean room. This makes it possible to decrease the possibility that the clean room is contaminated by dust produced in the fixed guide rail 21. Also, the traveling space 34 and the suction through passages 49 are separated, and the slit-like or hole-like dust collecting openings 50 are formed between them. This can raise the dust collecting force.

Although not shown, the traveling guide rail 22 extended between the fixed guide rails 21 has substantially the same structure as the fixed guide rails 21. The difference is that the power-supply rail 32 of the fixed guide rail 21 supplies electric power to a power-supply rail of the traveling guide rail 22 via the collectors 45 of the traveling unit 33.

Figure 9:
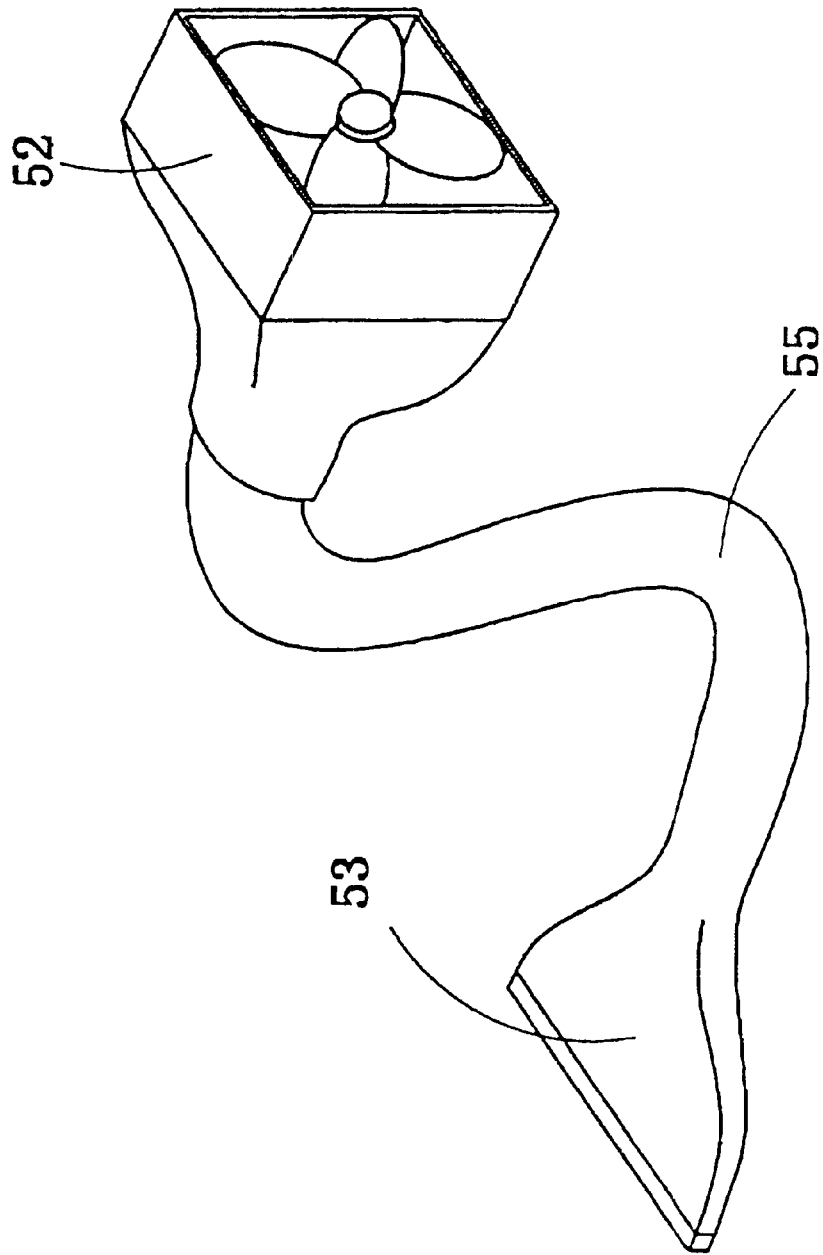
FIG. 9 is a perspective view showing a suction device.
Figure 10:
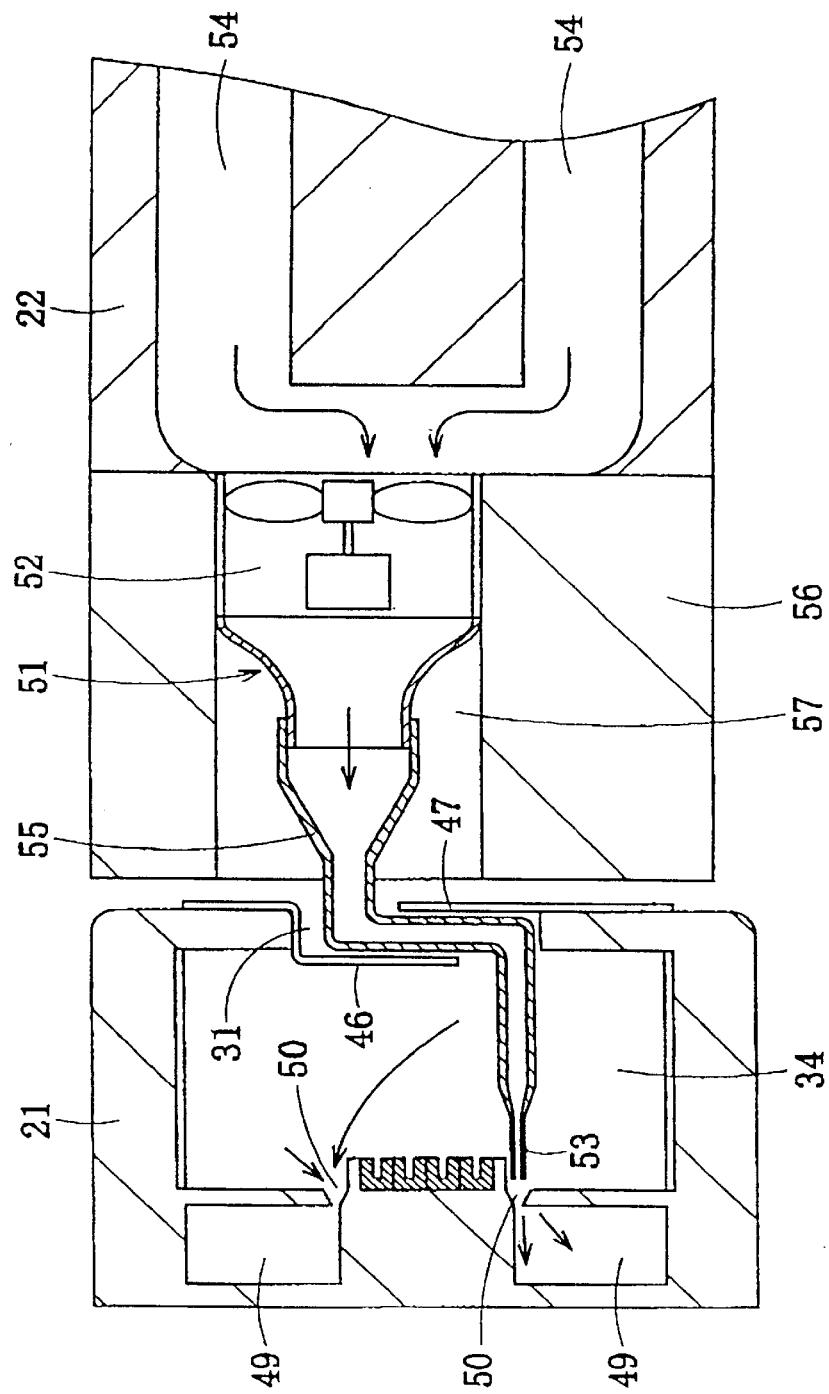
FIG. 10 is a sectional view showing the state in which the suction device shown in FIG. 9 is attached to the end portion of a guide rail.

As shown in FIG. 10, an exhaust coupling adapter 56 is inserted between the end portion of the traveling guide rail 22 and the traveling unit 33. A suction device 51 as shown in FIG. 9 is accommodated in a space 57 of this exhaust coupling adapter 56. This suction device 51 has a construction in which an exhaust duct 53 whose end portion opening is thinned into the shape of a slit is connected to the exhaust side of an exhaust fan 52 via a shape-retaining flexible tube 55. The exhaust fan 52 is fixed in the space 57 of the exhaust coupling adapter 56. The flexible tube 55 is guided into the traveling space 34 in the fixed guide rail 21 through the gap between the shielding plates 46 and 47. The exhaust duct 53 is fastened to the slider 35 such that the end portion of the exhaust duct 53 opposes the dust collecting opening 50. Also, two suction through passages 54 formed in the traveling guide rail 22 communicate with the space 57 (or the exhaust fan 52) of the exhaust coupling adapter 56 at the end portion of the traveling guide rail 22.

When receiving electric power supplied from the slider 35, the exhaust fan 52 rotates to draw air in the suction through passages 54 of the traveling guide rail 22 by suction and forcedly exhausts the air to the suction through passages 49 in the fixed guide rail 21 through the flexible tube 55 and the exhaust duct 53. Therefore, dust produced in the traveling guide rail 22 is discharged to the suction through passages 49 in the fixed guide rail 21 via the suction through passages 54 and the suction device 51 and exhausted to the outside of the clean room. Referring to FIG. 10, the end portion of the exhaust duct 53 opposes the dust collecting opening 50, so both the exhaust force of the exhaust fan 52 and the suction force at the dust collecting openings 50 directly and strongly exhaust air in the suction through passages 54 in the traveling guide rail 22 to the suction through passages 49 in the fixed guide rail 21. However, the distal end portion of the exhaust duct 53 can also be placed at a position apart from the dust collecting openings 50 in the traveling space 34 of the fixed guide rail 21. When this is the case, air in the suction through passages 54 of the traveling guide rail 22 is exhausted to the traveling space 34 in the fixed guide rail 21 by the exhaust fan 52 and further exhausted outside the clean room from the suction through passages 49.

The suction device 51 herein mentioned includes the exhaust fan 52. However, a suction device having no exhaust fan may be used. That is, the suction through passages 49 in the fixed guide rail 21 and the suction through passages 54 in the traveling guide rail 22 may be connected only by the exhaust duct 53 and the flexible duct 55 to forcedly exhaust air in the suction through passages 54 of the traveling guide rail 22 by the suction force of the suction through passages 49 in the fixed guide rail 21.

Although not shown, the traveling member 23 running along the traveling guide rail 22 also has substantially the same structure as the traveling unit 33 of the fixed guide rail 21. That is, the traveling member 23 runs along the traveling guide rail 22 by driving a motor by electric power received from a power-supply rail of the traveling guide rail 22 via collectors.

Figure 11:
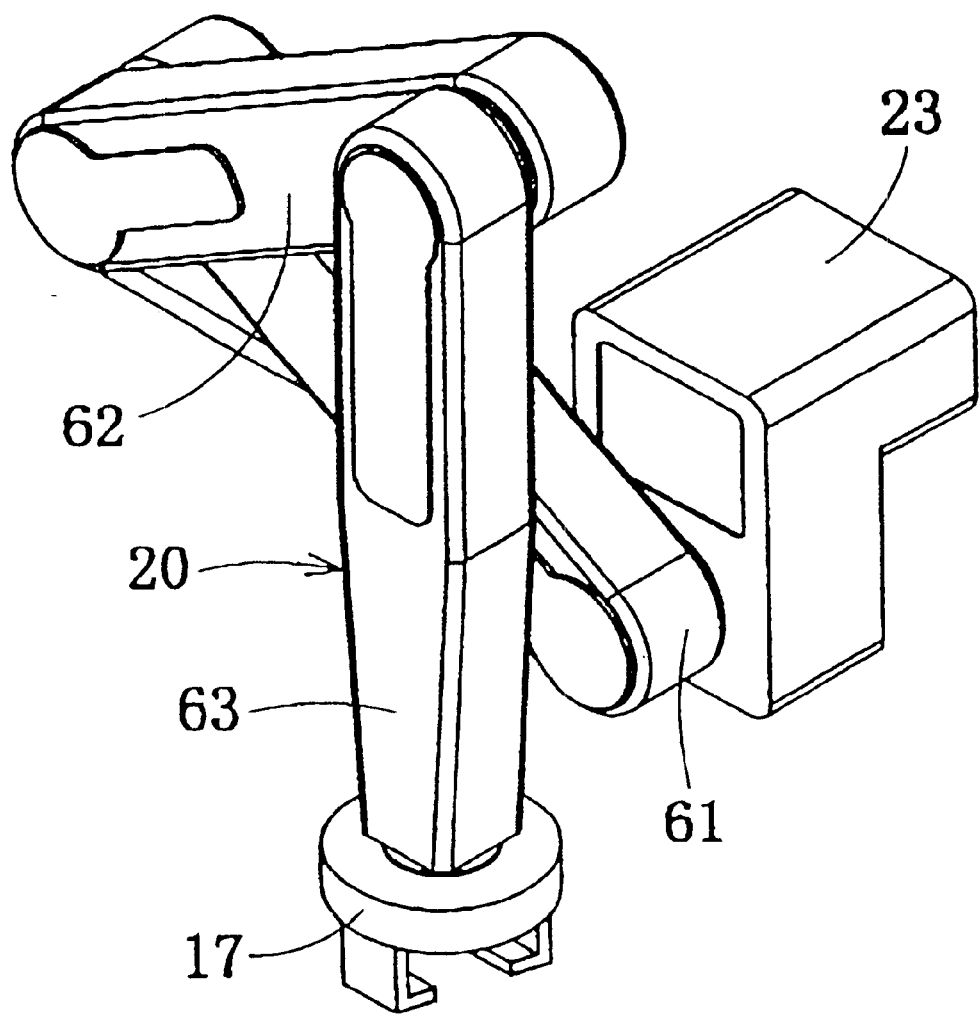
FIG. 11 is a perspective view of a work lifter.
Figure 12A:
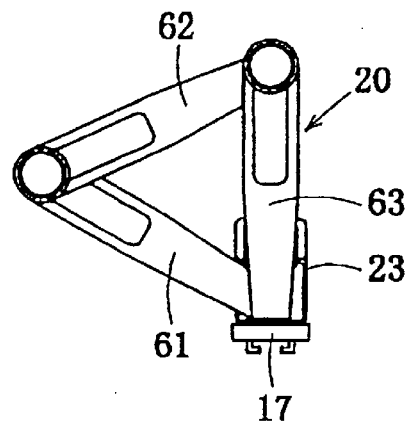
FIG. 12A is a front view showing the work lifter which has raised a work holder to the uppermost point.
Figure 12B:
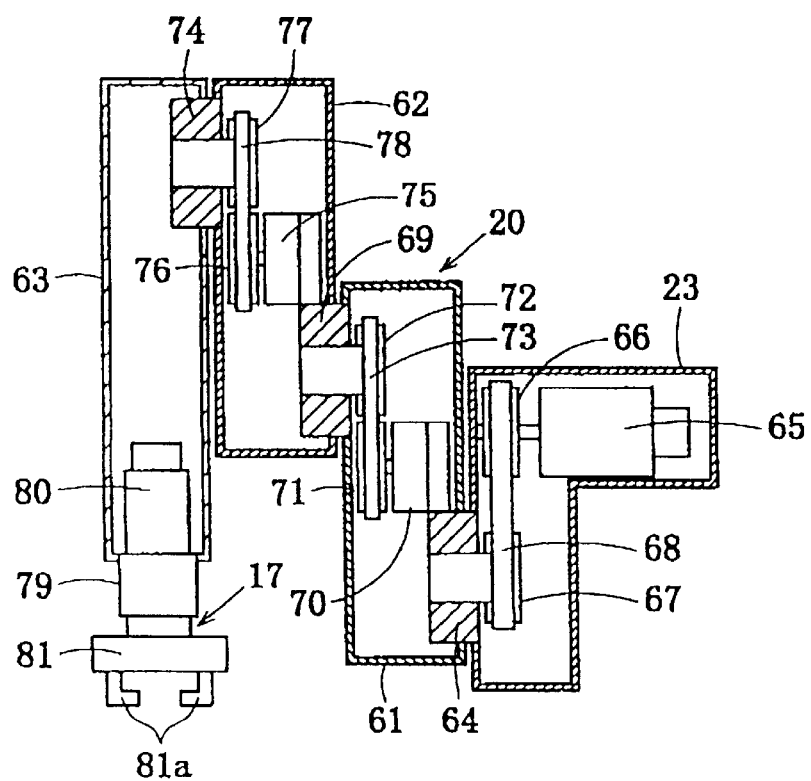
FIG. 12B is a sectional view for explaining the structure of the work lifter.
Figure 13A:
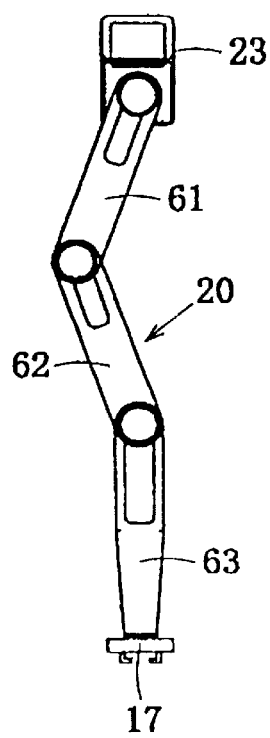
FIG. 13A is a front view showing the work lifter which has lowered the work holder to the lowermost point.
Figure 13B:
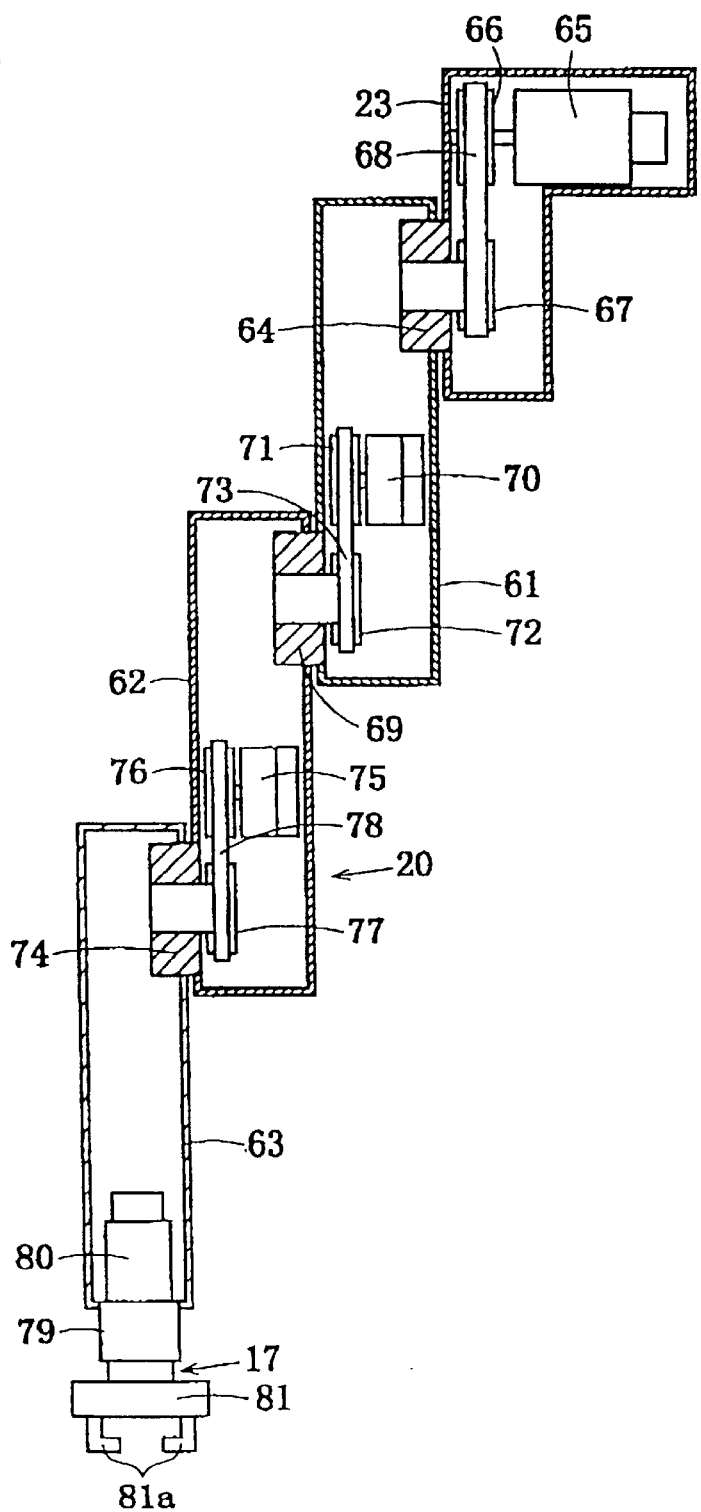
FIG. 13B is a sectional view for explaining the structure of the work lifter.

The work lifter 20 of the traveling member 23 has a link arm structure which linearly moves up and down vertically to the floor 11 of the clean room. The work lifter 20 shown in FIG. 11 is constructed by connecting three arms 61, 62, and 63. These arms 61, 62, and 63 communicate with each other, and the work lifter 20 has a closed structure as a whole. One end of the work lifter 20 is pivotally connected to the traveling member 23, and the work holder 17 is attached to the other end. As shown in FIG. 12B or 13B, the proximal end joint of the first arm 61 is attached to the output portion of a reduction gear 64 fixed to the traveling member 23. A timing belt 68 is looped between a timing pulley 66 attached to a motor 65 installed in the traveling member 23 and a timing pulley 67 attached to the input side of the reduction gear 64. Similarly, the proximal end joint of the second arm 62 is attached to the output portion of a reduction gear 69 fixed to the distal end joint of the first arm 61. A timing belt 73 is looped between a timing pulley 71 attached to a motor 70 installed in the first arm 61 and a timing pulley 72 attached to the input side of the reduction gear 69. Also, the proximal end joint of the third arm 63 is attached to the output portion of a reduction gear 74 fixed to the distal end joint of the second arm 62. A timing belt 78 is looped between a timing pulley 76 attached to a motor 75 installed in the second arm 62 and a timing pulley 77 attached to the input side of the reduction gear 74. The work holder 17 has a structure in which a holding unit (chuck) 81 is attached to the output portion of the reduction gear 79 air-tightly fixed to the distal end joint of the third arm 63 and is opened and closed by a motor 80 installed in the third arm 63 via a reduction gear 79.

This work lifter 20 can be driven by transmitting the rotational forces of the built-in motors 65, 70, and 75 of the traveling member 23 and the first and second arms 61 and 62 to the reduction gears 65, 69, and 74 by the timing pulleys and timing belts and rotating the arms 61, 62, and 63 fixed to the outputs of these reduction gears 64, 69, and 74, respectively. That is, the work holder 17 can be moved up by folding the arms 61, 62, and 63 as shown in FIGS. 12A and 12B, and moved down by stretching these arms 61, 62, and 63 as shown in FIGS. 13A and 13B. In this multi-arm structure, the contraction ratio in the lifting direction of the state in which the three arms 61, 62, and 63 are folded and contracted to the state in which they are maximally expanded is large. Therefore, the spacing (space height) from the processing chambers 12 to the ceiling of the clean room can be reduced. This can reduce the installation cost and maintenance cost of the clean room.

When the speed reduction ratio between the shafts of the joints used in the work lifter 20 is set at 1:2:1, the third arm 63 linearly moves in the vertical direction when the arms 61, 62, and 63 are driven at the same input rotational speed. So, the work holder 17 attached to the lower end of the third arm 63 linearly moves up and down in the vertical direction. Also, by electronically controlling the driving actions (rotational angles) of the motors 65, 70, and 75 in connection with each other, the work holder 17 can be linearly operated so as to move up and down only along a straight line perpendicular to the floor 11. It is of course possible to control the motors 65, 70, and 75 point to point such that the work holder 17 moves from a certain position to another.

The output shafts of the reduction gears 64, 69, and 74 at the joints of the work lifter 20 are rotary hollow shafts, so cavities extend through these reduction gears 64, 69, and 74. Portions between the traveling member 23 and the first arm 61, between the first and second arms 61 and 62, and between the second and third arms 62 and 63 communicate with each other via the cavities in the reduction gears 64, 69, and 74, respectively. The joints between the traveling member 23 and the arms 61, 62, and 63 maintain airtightness to such an extent that dust does not leak to the outside. For example, seals using a magnetic fluid or the like are attached to rotating portions of the reduction gears 64, 69, and 74 to prevent outflow of dust from the joints to the outside. In this work lifter 20, therefore, the movable portions can be sealed inside, so release of dust from these movable portions to the outside can be prevented. Also, the internal spaces of the arms 61, 62, and 63 communicate with each other via the hollow shafts (reduction gears) at the joints. Furthermore, the first arm 61 communicates with the interior of the traveling member 23 via the reduction gear 64, and the interior of the traveling member 23 communicates with the interior of the traveling guide rail 22 (the traveling member 23 also has a suction means similar to the suction device 51 shown in FIG. 9). Hence, dust produced in the arms 61, 62, and 63 is drawn by suction to the suction through passages 54 in the traveling guide rail 22 via the traveling member 23 and discharged outside the clean room via the suction through passages 49 in the fixed guide rail 21. In this manner, the work lifter 20 can minimize contamination of the clean room caused by the vertical movement of the work holder 17. Note that driving power cables and the like of the motors 65, 70, and 75 can be guided to the traveling member 23 via the cavities in the reduction gears 64, 69, and 74. So, electric power can be supplied from the collectors 45 of the traveling member 23 to these motors 65, 70, and 75.

The work holder 17 rotates the holding unit 81 by the motor 80 and the reduction gear 79, thereby changing the attitude of a work. Also, the holding unit 81 can open and close a claw 81a by a built-in electrical or static driving source. With this claw 81a, the holding unit 81 can hold a handle 92 on the top surface of the closed container 16.

The work conveying system has the structure as described above. Therefore, the closed container 16 can be conveyed as it is held by the work holder 17, can be horizontally conveyed parallel to the fixed guide rails 21 by running the traveling guide rail 22 along the fixed guide rails 21, can be horizontally conveyed parallel to the traveling guide rail 22 by running the traveling member 23 along the traveling guide rail 22, and can be vertically moved by driving the work lifter 20. By simultaneously combining these operations, the closed container 16 can be conveyed in an arbitrary direction in a three-dimensional space.

In the work conveying system as described above, the work holder 17 can be horizontally moved to an arbitrary position by driving the traveling guide rail 22 and the traveling member 23, and works can be vertically moved by the work lifter 20. This allows the work holder 17 to freely move in the three-dimensional space above the processing chambers 12. Consequently, it is possible to access the interface apparatus 13 added to the processing chamber 12 installed in a given position or to access the work standby station 14.

Compared to a conventional work conveying system in which an automatic guided vehicle runs on the floor, the work conveying system of the present invention obviates the work transfer area between the processing chambers or between the interface apparatuses. This permits efficient use of the space in the clean room. That is, since the work transfer area conventionally necessary on the floor can be eliminated, the necessary area of the clean room can be decreased, so the installation cost and operation cost of the clean room can be greatly reduced. Also, since the upper space in the clean room can be used as a transfer path, it is possible to eliminate interference with other factory equipment installed on the floor and minimize the occurrence of troubles caused by work transfer. Furthermore, neither apparatuses nor facilities necessary for work transfer are installed on the floor, so maintenance of the processing chambers by maintenance workers is not interfered with.

Also, in the work conveying system according to the present invention, an arbitrary upper space in the clean room can be used as a work transfer path. Therefore, the work transfer path can be determined without being limited by the installation positions of the processing chambers 12 and the like. In addition, the processing chambers 12 can be arranged on the floor 11 independently of the work transfer path.

Furthermore, in the work conveying system according to the present invention, the work holder 17 can be moved to an arbitrary position, and an arbitrary transfer path can be freely chosen. In particular, the positions of the interface apparatuses 13 can be represented by X- and Y-coordinates in the clean room regardless of the positions of the processing chambers 12. Therefore, the work transfer position can be easily controlled by matching the position of the traveling unit 33 along the fixed guide rail 21 with the X-coordinate and the position of the traveling member 23 along the traveling guide rail 22 with the Y-coordinate. The work holding position of the work lifter 20 can also be matched with the Z-coordinate. Accordingly, the processing chambers 12 need not be arranged in order; they can be arranged at random by avoiding obstacles. This can alleviate limitations on the installation positions of the processing chambers 12 and the like.

Even after the processing chambers 12 and the like are once arranged, they can be rearranged for renewal of the interior of the clean room or a new processing chamber 12 or the like can be added with almost no change in the hardware of the work conveying system. That is, the work transfer paths can be changed only by changing the software for operating the work conveying system. Accordingly, even when it is necessary to change processing steps of factory equipment for products having short life cycles, the existing equipment can be effectively used. This can minimize the additional cost.

Also, the work holder 17 can be linearly moved the shortest distance in the space above the processing chambers 12. Therefore, the ratio of the necessary transfer time to the work processing time can be decreased. Consequently, the work processing time (tact time) in the whole clean room can be shortened.

(Closed Container)

Figure 15:
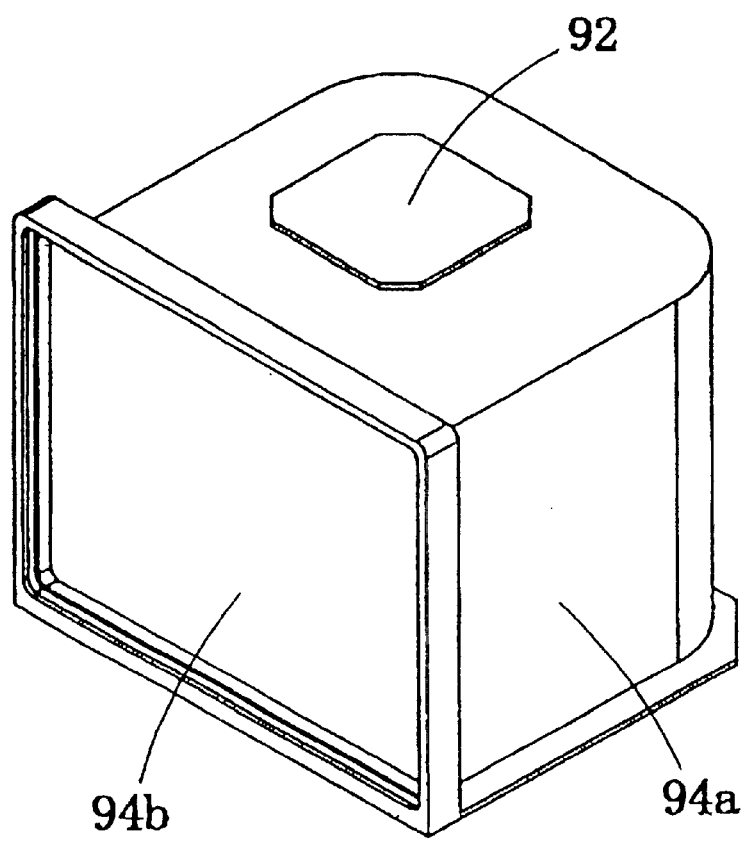
FIG. 15 is a perspective view of the closed container whose airtight door is closed.

FIGS. 14 and 15 show the structure of the closed container 16. This closed container 16 allows transfer of works 91 in a clean environment. The closed container 16 includes a container main body 94*a* and an airtight door 94*b*. The handle 92 to be held by the holding unit 81 of the work holder 17 is mounted on the top surface of the container main body 94*a*. The closed container 16 can be carried from one processing chamber 12 to another processing chamber 12 by holding the handle 92 by the holding unit 81. The interior of this closed container 16 can be airtightly sealed, so the closed container 16 can withstand high-speed transfer by the work conveying system. A number of racks 93 are formed inside the container main body 94*a*. The work 91 such as a plate-like substrate or wafer can be horizontally placed on each rack 93. The works 91 can be taken in and out by opening the airtight door 94*b* at the front of the closed container 16. The interior can be airtightly sealed by closing this airtight door 94*b*.

Figure 16A:
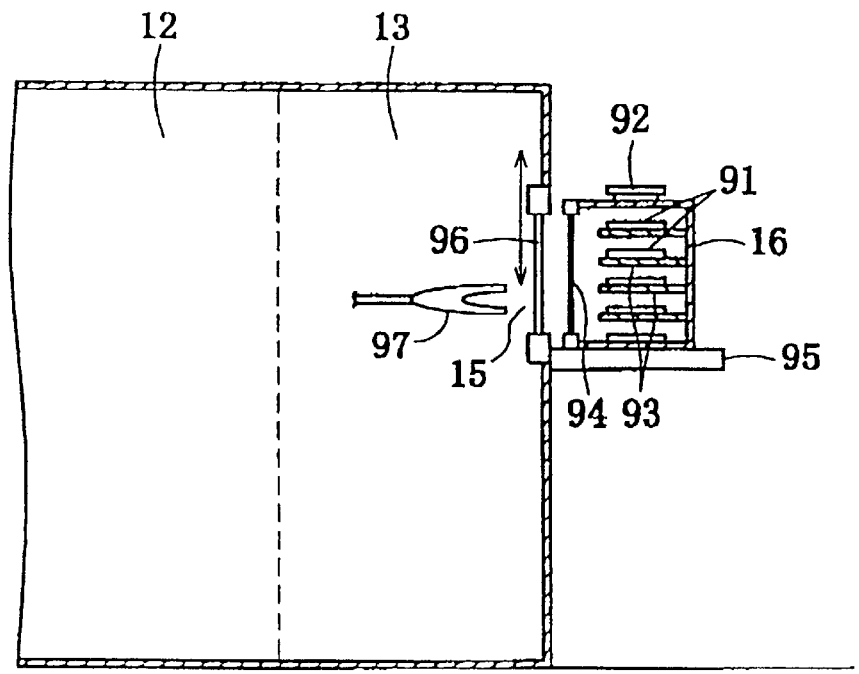
FIG. 16A is a sectional view showing the closed container placed on a work table of an interface apparatus.
Figure 16B:
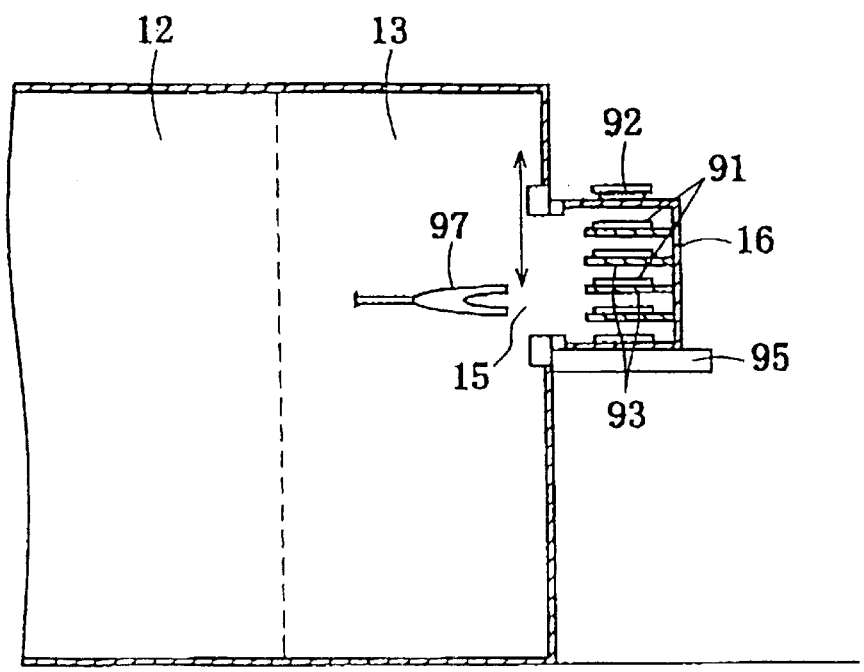
FIG. 16B is a sectional view showing the state in which an opening/closing shutter of the interface apparatus and a rising door of the closed container are opened to allow the interface apparatus and the closed container to communicate with each other.

The container main body 94*a* has a structure by which the perimeter of the opening can be airtightly connected to the perimeter of a work loading/unloading port 15 of the interface apparatus 13. The airtight door 94*b* can be opened only when the opening perimeter of the container main body 94*a* is airtightly connected to the perimeter of the work loading/unloading port 15. As shown in FIG. 16A, the closed container 16 is placed on a work table 95 of the interface apparatus 13. When this closed container 16 is carried to the work loading/unloading port 15 by the work table 95, the opening perimeter of the container main body 94*a* is airtightly connected to the perimeter of the work loading/unloading port 15. Subsequently, when an opening/closing shutter 96 of the interface apparatus 13 opens as shown in FIG. 16B, a door holding device (not shown) of the interface apparatus 13 holds and opens the airtight door 94 of the closed container 16 to permit the interiors of the interface apparatus 13 and the closed container 16 to communicate with each other. Note that this door holding device holds the airtight door 94*b* by, e.g., a mechanical means, suction means, or magnetic means.

Accordingly, the internal space of this closed container 16 can be shielded from the external atmosphere (the atmosphere in the clean room). Therefore, even if the cleanliness in the clean room (the outside of the processing chambers 12 and the like) is more or less low, the works 91 can be conveyed while the cleanliness of the atmosphere contacting the works 91 is held constant.

As described above, the works 91 are conveyed as they are sealed in the closed container 16 without being exposed. Hence, the cleanliness of the internal space of the clean room except the processing chambers 12, the interface apparatuses 13, and the closed containers 16 can be low, so the installation cost and operation cost of the clean room can be reduced. If the clean room cost can be reduced by lowing the required level of cleanliness, a certain wide area can be secured for a clean room. This allows clean room design taking account of extensibility. For example, although the number of the processing chambers 12 may be small at first when the clean room is built, it is sometimes planned to gradually add new processing chambers 12 or replace the old processing chambers with high-performance, large processing chambers 12. When this is the case, high extensibility can be realized by using the combination of the highly flexible work conveying system and the closed container 16 of the present invention. Also, even works requiring a novel complicated and sophisticated process can be processed without rebuilding the clean room. This can minimize the installation cost and can contribute to the manufacture of products (works) having high cost competitive power.

(Processing in Clean Room)

Figure 17:
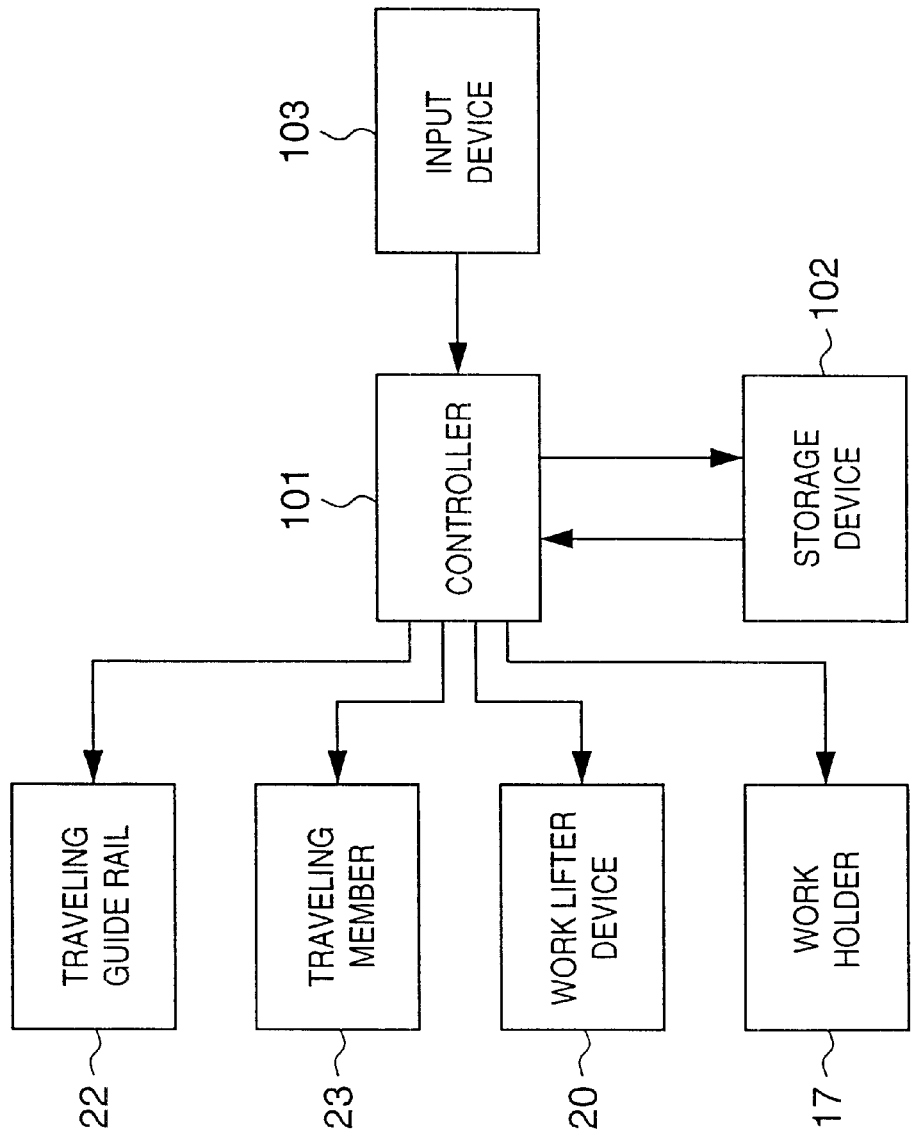
FIG. 17 is a schematic block diagram showing a configuration for controlling the work conveying system.

In the work conveying system as described above, the closed container 16 containing the works 91 is held by the work holder 17, conveyed from one processing chamber 12 to another processing chamber 12 or between the processing chamber 12 and the work standby station 14, and subjected to predetermined processing in each processing chamber 12. To this end, data of the installation positions of the interface apparatuses 13 and the transfer order is previously input to the work conveying system. As shown in FIG. 17, the work conveying system includes a controller 101 for automatically selecting a path in the upper space of an area except for each processing chamber 12.

After the processing chambers 12 and the interface apparatuses 13 are installed in the clean room, process content information of each processing chamber 12 and arrangement information of the interface apparatuses 13 are input from an input device 103 such as a keyboard or console to a storage device 102 of the controller 101 for controlling the work conveying system. On the basis of these pieces of information and preset diverse pieces of information concerning work transfer (e.g., conditions for not disturbing the down flow air), the controller 101 automatically calculates and selects a transfer path following a predetermined procedure. This transfer path selected by the controller 101 is generally not a space immediately above each processing chamber 12 but a space above an intermediate area (e.g., a maintenance area) between the processing chambers 12.

When the transfer path is chosen by the controller 101, the work conveying system transfers the works 91 along the path. This permits work transfer by which disturbance of the cleanliness in the clean room is minimized. For example, if a path close to the perimeter, rather than the center, of the clean room is set as an optimum condition, the controller 101 automatically calculates an optimum transfer path in accordance with physical conditions such as the size and arrangement of the processing chambers 12 and human judgement conditions taking a special circumstance occurring on each occasion into consideration, and transfers works by controlling the work conveying system. This allows a free optimum transfer path selection taking preservation of the severe clean room environment into account.

When the closed container 16 is thus conveyed to the interface apparatus 13 by the work conveying system, as shown in FIG. 16A, the work lifter places the closed container 16 on the work table 95 at the front of the interface apparatus 13. When the closed container 16 is placed on the work table 95, the work conveying system releases the closed container 16 from the work holder 17. This also releases the work conveying system from the closed container 16. When the closed container 16 is placed, the work table 95 transfers the closed container 16 to bring the perimeter of the airtight door 94b of the closed container 16 into tight contact with the perimeter of the work loading/unloading port 15 of the interface apparatus 15. When the perimeter of the airtight door 94b of the closed container 16 comes in contact with the perimeter of the work loading/unloading port 15, the perimeter of the airtight door 94b airtightly connects to the perimeter of the work loading/unloading port 15.

Subsequently, when the opening/closing shutter 96 of the interface apparatus 13 is opened as shown in FIG. 16B, the door holding device opens the airtight door 94b of the closed container 16. Consequently, the interiors of the interface apparatus 13 and the closed container 16 communicate with each other while airtightness is held against the outside. The work loader/unloader 97 of the interface apparatus 13 loads the works 91 such as semiconductor wafers from the closed container 16 into the processing chamber 12. The work loader/unloader 97 also returns the works 91 completely processed in the processing chamber 12 into the empty closed container 16.

When all the works 91 completely processed are returned to the closed container 16, the opening/closing shutter 96 of the interface apparatus 13 is closed, and the door holding device closes the airtight door 94b of the closed container 16. When the processed works 91 are thus sealed in the closed container 16 as in the original state, the work conveying system again holds the closed container 16 and transfers it to the processing chamber 12 of the next step.

The work standby station 14 is installed as shown in FIG. 3 in a place apart from the processing chambers 12 in the clean room. When the closed container 16 is moved from one processing chamber 12 to another processing chamber 12, the closed container 16 can be temporarily stocked on this work standby station 14. Since the work standby station 14 is present, when the closed container 16 is conveyed from the processing chamber 12 of a certain step to the processing chamber 12 of another step, the closed container 16 can be placed on the work standby station 14 and allowed to temporarily stand by if the processing chamber 12 as the transfer destination is operating. During the waiting time before the processing chamber 12 of the subsequent step becomes ready to accept the closed container 16, this work standby station 14 permits control of another processing chamber 12 or transfer of another closed container 16. That is, the operation efficiency of the work conveying system can be improved by making the work standby station 14 adjust the timings of work processing or function as a buffer. Note that when the height of the work placement surface of the work standby station 14 is close to the work holding position in work transfer, it is possible to shorten the lifting operation time for placing the closed container 16 on the work standby station 14 or picking up the closed container 16 from it. This can further increase the work efficiency.

Also, for the same reason as for the work standby station 14, a plurality of sets of the work loading/unloading ports 15 and the work tables 95 are formed at the front of each interface apparatus 13. Accordingly, a plurality of closed containers 16 can be efficiently processed without any waiting time.

As described above, the closed container 16 is conveyed from one processing chamber 12 to another processing chamber 12 by the work conveying system, and subjected to predetermined processing in each processing chamber 12. When the closed container 16 is completely subjected to all processing steps, the processing in the clean room is completed.

(Another Work Lifter)

In the above embodiment, the arm type work lifter 20 is explained. This work lifter 20 can also have a sliding structure (telescopic structure) as shown in FIG. 18 by which the work holder 17 at the lower end is vertically, linearly moved up and down.

Figure 18:
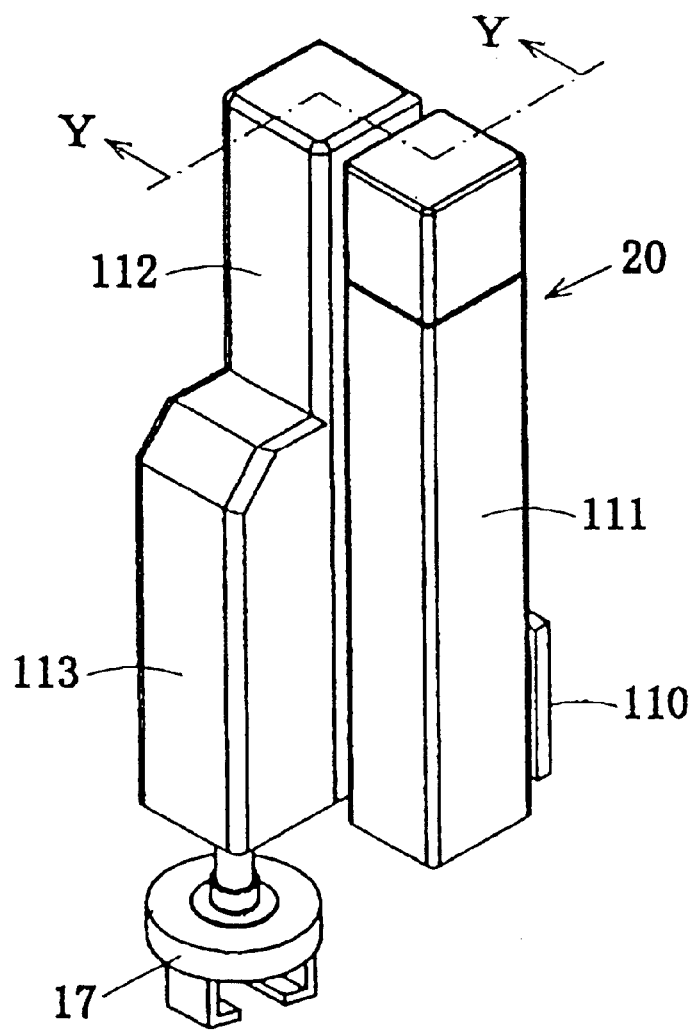
FIG. 18 is a perspective view showing a work lifter having another structure.
Figure 19:
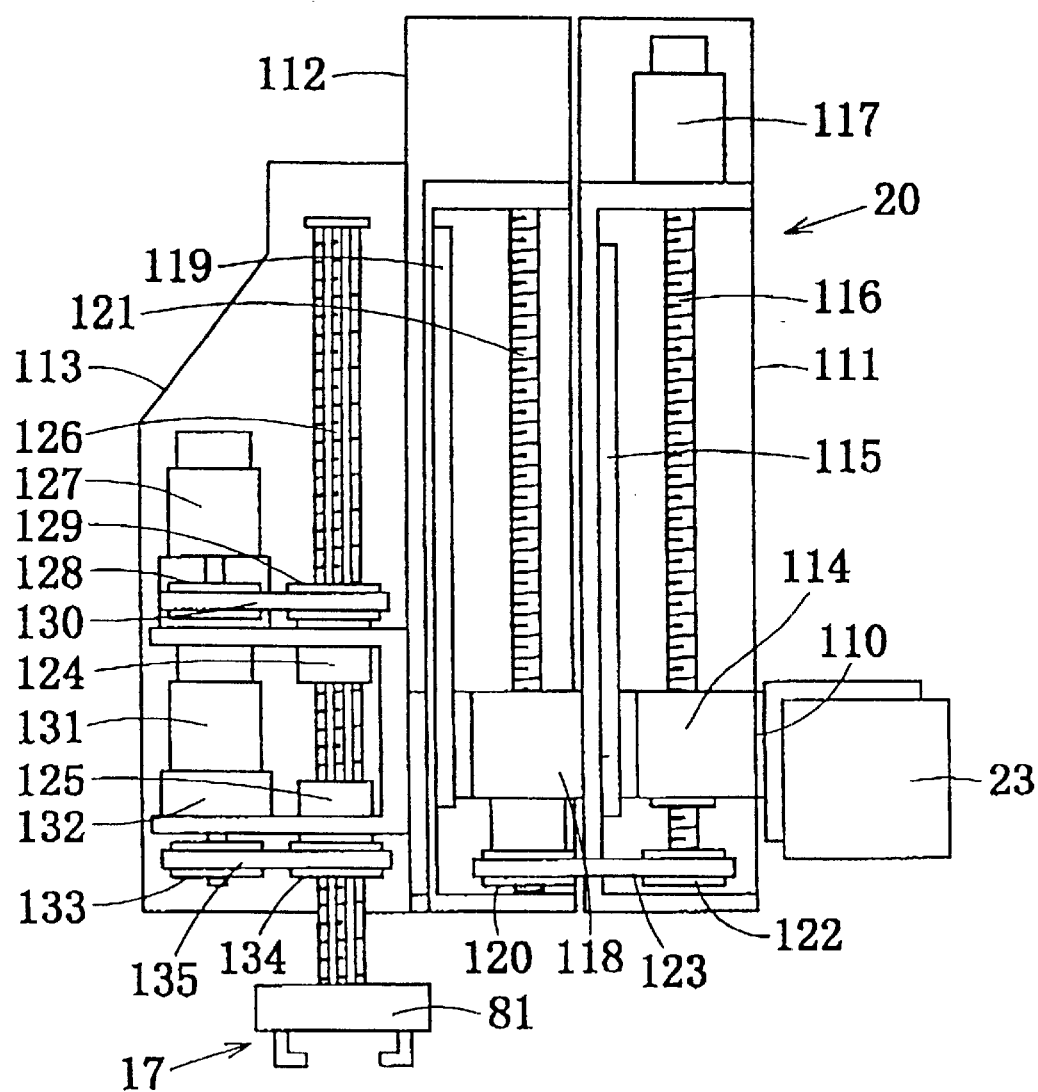
FIG. 19 is a schematic view showing the section of the work lifter taken along a line Y—Y in FIG. 18 with its work holder being raised.
Figure 20:
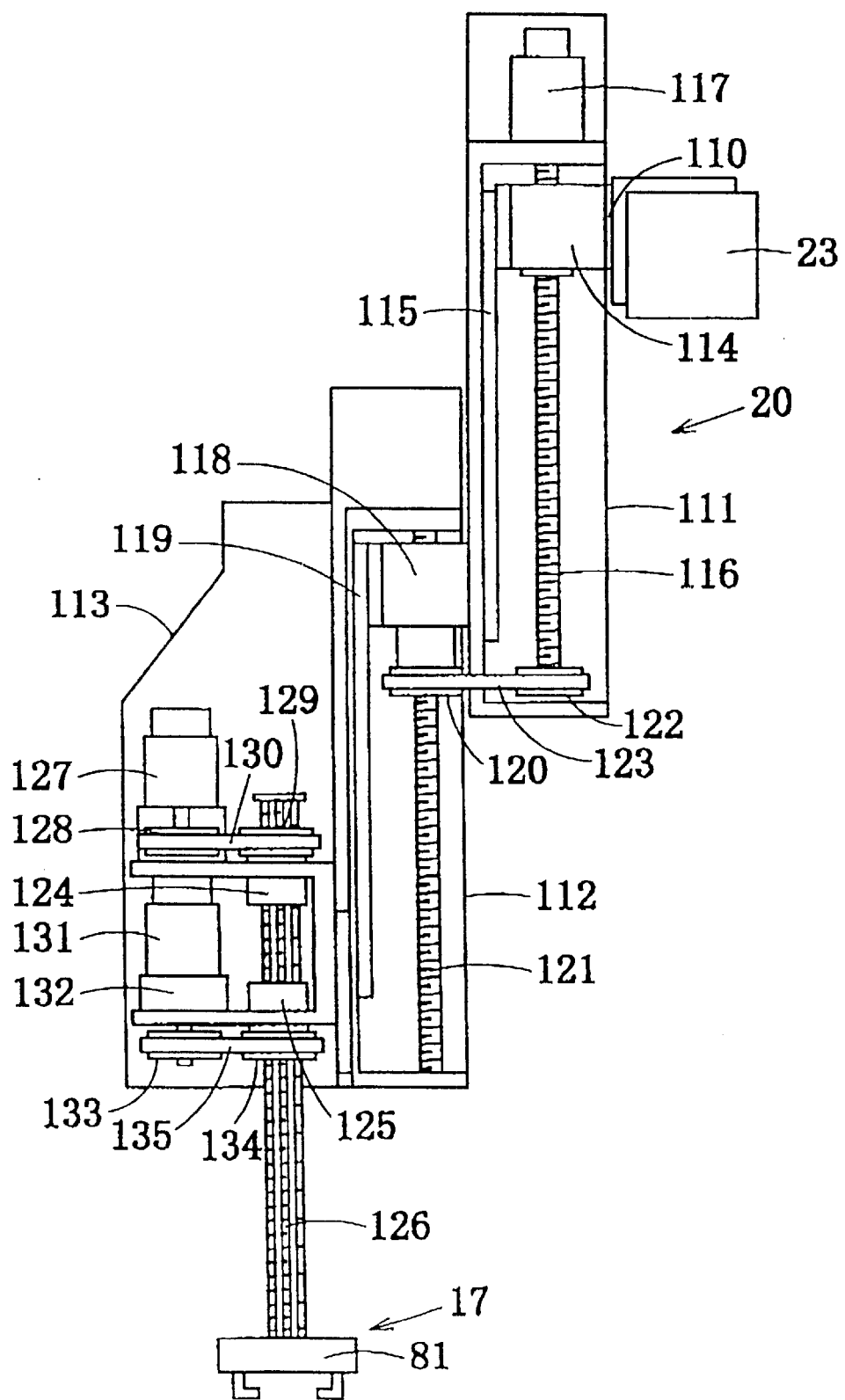
FIG. 20 is a schematic view showing the section of the work lifter taken along the line Y—Y in FIG. 18 with its work holder being lowered.

FIGS. 19 and 20 are sectional views taken along a line Y—Y in FIG. 18, showing the states in which the work holder 17 is raised and lowered, respectively. Reference numeral 110 denotes a mounting portion to be mounted on the traveling member 23 which runs along the traveling guide rail 22. This work lifter 20 has a first frame 111, second frame 112, and third frame 113 in this order from the mounting portion 110. A slider 114 housed in the first frame 111 is slidably attached to a guide rail 115 fixed to the first frame 111, and is fastened to the mounting portion 110. A ball screw 116 rotatably supported in the first frame 111 is meshed with the slider 114 and is coupled with a motor 117 installed in the first frame 111. When the motor 117 is driven to rotate the ball screw 116, therefore, the slider 114 moves along the guide rail 115 accordingly. Since, however, this slider 114 is fixed to the mounting portion 110, the first frame 111 moves up or down with respect to the mounting portion 110.

A slider 118 accommodated in the second frame 112 is slidably attached to a guide rail 119 fixed to the second frame 112, and is fastened to the first frame 111. A timing pulley 120 is rotatably attached to the slider 118. A ball screw 121 fixed in the second frame 112 is meshed with this timing pulley 120. A timing pulley 122 is fastened to the end portion of the ball screw 116 of the first frame 111. A timing belt 123 is looped between this timing pulley 122 and the timing pulley 120 in the second frame 112. Therefore, when the motor 117 in the first frame 111 rotates the ball screw 116, the timing pulley 120 rotates via the timing pulley 122 and the timing belt 123, and this moves the slider 118 along the ball screw 121. As a consequence, the second frame 112 moves up or down along the first frame 111. When the motor 117 is driven, the first and second frames 111 and 112 move in the same direction by equal moving amounts. Hence, the second frame 112 moves a distance twice the distance the first frame 111 moves with respect to the mounting portion 110.

The third frame 113 is placed adjacent to the second frame 112. In this third frame 113, a ball screw nut 124 and a spline nut 125 are arranged in upper and lower portions, respectively. A ball screw spline 126 (a plurality of spline grooves are formed in a ball screw) is meshed with these nuts 124 and 125. A timing belt 130 is looped between a timing pulley 128 attached to a motor 127 and a timing pulley 129 of the ball screw nut 124. Also, a timing belt 135 is looped between a timing pulley 133 attached to a reduction gear 132 driven by a motor 131 and a timing pulley 134 of the spline nut 125. The work holder 17 for holding the closed container 16 is attached to the lower ends of the three ball screw splines 126. Accordingly, the work holder 17 can be moved up and down and rotated by rotating the ball screw nut 124 and the spline nut 125 by driving the motors 127 and 131.

The work lifter 20 having the above structure increases the contraction ratio in the lifting direction of the state in which the frames 111, 112, and 113 contract to the state in which they stretch maximally. This allows the work lifter 20 to have a long stroke. Especially when the frames 111, 112, and 113 have multiple stages, the contraction ratio in the direction of lifting can be further increased. Consequently, the height of the space from the processing chambers 12 to the clean room ceiling can be shortened. So, it is possible to reduce the installation cost and maintenance cost of the clean room.

Also, although detailed explanation will be omitted, this work lifter 20 has a closed structure as a whole, the interiors of the frames 111, 112, and 113 communicate with each other, and the interior of the work lifter 20 communicates with the interior of the traveling member 23.

(Second Embodiment)

Figure 21:
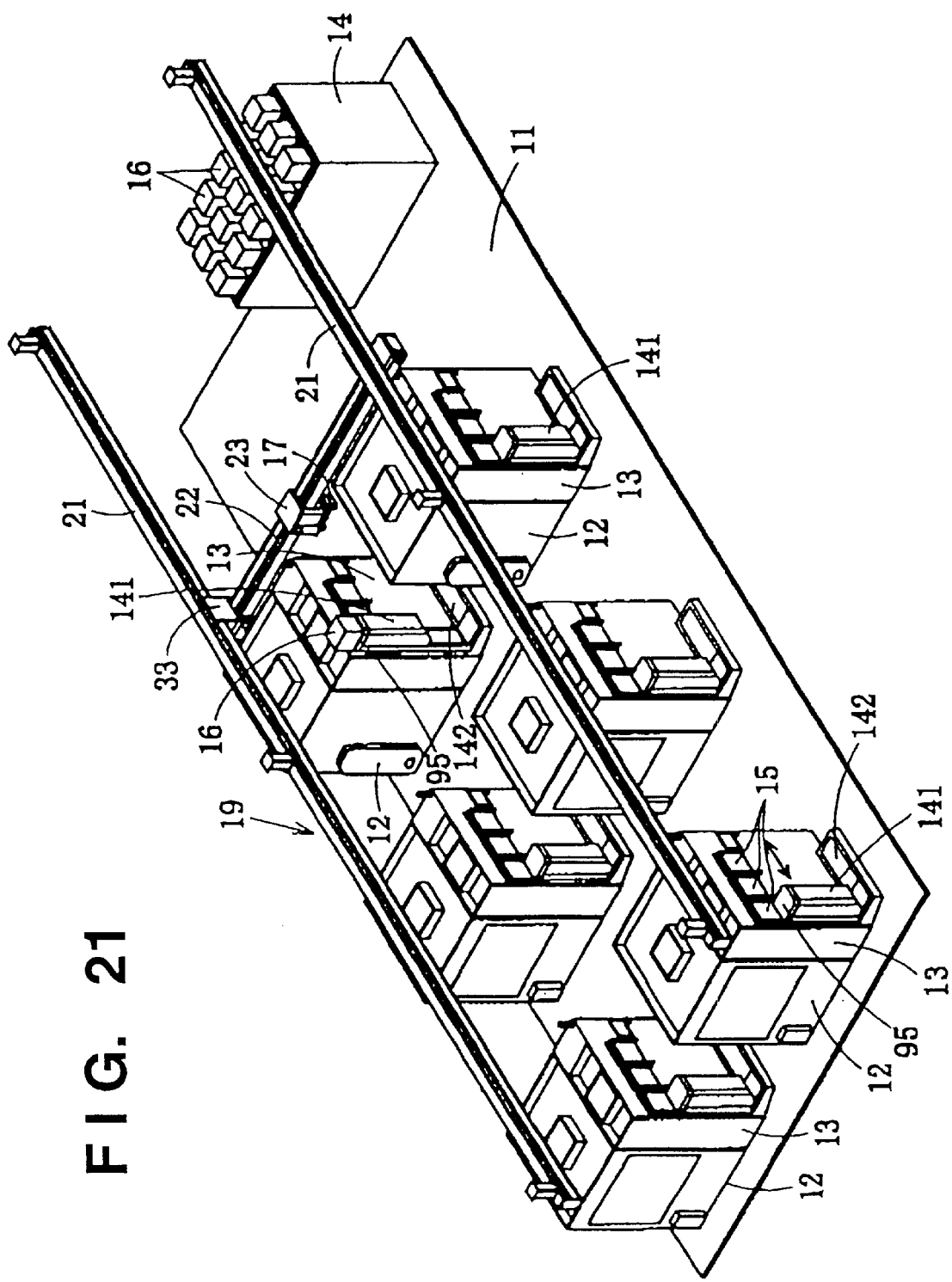
FIG. 21 is a perspective view showing the interior of a clean room including a work conveying system according to another embodiment of the present invention.

FIG. 21 is a perspective view showing the interior of a clean room including a work conveying system according to another embodiment of the present invention. In this work conveying system, a traveling guide rail 22 running along fixed guide rails 21 and a traveling member 23 running along the traveling guide rail 22 constitute a horizontal moving mechanism 19. Unlike the first embodiment, the traveling member 23 has no work lifter 20. Therefore, a work holder 17 is directly mounted on the traveling member 23. In a work conveying system like this, a closed container 16 can be held and conveyed only in a horizontal plane. However, by setting the holding position of the closed container 16 to be slightly higher than the height of a processing chamber 12 and an interface apparatus 13, the closed container 16 can freely move in a two-dimensional space above the processing chamber 12 without interfering with the processing chamber 12 or the interface apparatus 13.

In this work conveying system, each interface apparatus 13 has a work lifter 141 for moving a work (closed container 16) up and down by raising or lowering a work table 95 (this work lifter 141 can also be installed adjacent to each interface apparatus 13). A plurality of work loading/unloading ports 15 are formed horizontally adjacent to each other in the front surface of the interface apparatus 13. In front of these work loading/unloading ports 15, the work lifter 141 is mounted on a horizontal moving unit 142. This horizontal moving unit 142 allows the work lifter 141 to horizontally move along the direction of arrangement of the work loading/unloading ports 15. Also, the work lifter 141 can raise the work table 95 to a position higher than the processing chamber 12 and the interface apparatus 13 and can lower the work lifter 141 to a position below the work loading/unloading ports 15.

In this work conveying system, the work table 95 stands by in a specific position of the work loading/unloading ports 15. Immediately before the work holder 17 carrying the closed container 16 arrives, the work lifter 141 raises the work table 95 to the height (the position higher than the processing chamber 12) at which the closed container 16 is to be conveyed, and causes the work table 95 to stand by. When the closed container 16 held by the work holder 17 comes to the work table 95, the work table 95 receives the closed container 16, and the work holder 17 releases the closed container 16. When the work lifter 141 lowers the work table 95 to the work loading/unloading ports 15, the work table 95 horizontally moves the closed container 16 to the work loading/unloading ports 15 of the interface apparatus 13. At this time, a work loader/unloader 97 is ready to load works at one of the work loading/unloading ports 15, so the work lifter 141 horizontally moves to this work loading/unloading port 15. After the interface apparatus 13 and the closed container 16 are connected, the work loader/unloader 97 for loading/unloading works between each work loading/unloading port 15 and the processing chamber receives works in the closed container 16.

In this work conveying system, the interface apparatus 13 has the work lifter 141. Therefore, after conveying the closed container 16 to the interface apparatus 13, the work holder 17 can immediately proceed on to another work transfer operation without moving up or down. This makes it possible to increase the speed of the work transfer operation and shorten the waiting time of other processing chambers 12, thereby improving the production efficiency.

Also, this interface apparatus 13 has a plurality of work loading/unloading ports 15. Hence, if a work loading/unloading port 15 immediately below the work lifter 141 having the closed container 16 placed on the work table 95 is not empty, the work lifter 141 can find another work loading/unloading port 15 and fill a plurality of work loading/unloading ports 15 with the closed containers 16. Accordingly, it is possible to eliminate the work waiting time of the work loader/unloader 97 in the interface apparatus 13 and improve the operation efficiency of the processing chamber 12.

Additionally, in this work conveying system, the work holder 17 does not require any height for lifting. Therefore, the height of the space above the processing chambers 12 can decrease. This can greatly reduce the installation cost and operation cost of the clean room.

Figure 22:
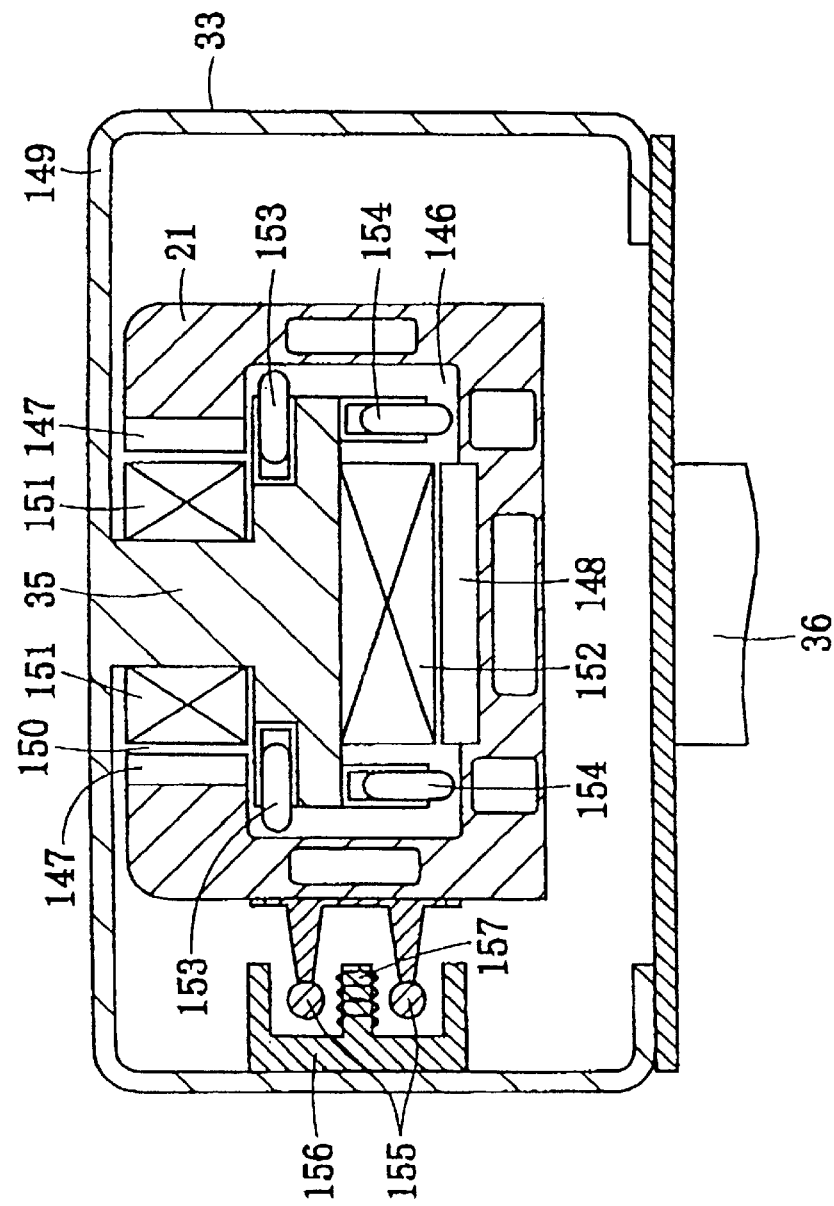
FIG. 22 is a sectional view showing the structures of a fixed guide rail and a traveling unit used in the work conveying system.

In this embodiment, a magnetic floating type linear motor which runs in a non-contact state as will be described below is used as a traveling driving force of a traveling unit 33 connected to the fixed guide rail 21. As shown in FIG. 22, the fixed guide rail 21 has a traveling space 146 open upward. On the two side surfaces and bottom surface of this traveling space 146, permanent magnets 147 and 148 are arranged over the entire length of the fixed guide rail 21 such that their polarities (N and S poles) are alternately inverted. The traveling unit 33 has a slider 35 suspended from a central portion of the ceiling of a cylindrical member 149 so formed as to enclose the fixed guide rail 21. This slider 35 is accommodated in the traveling space 146 from an upper opening 150. On those two side surfaces of the slider 35 housed in the traveling space 146, which oppose the permanent magnets 147 on the two side surfaces of the traveling space 146, electromagnetic coils 151 are arranged along the running direction at the same intervals as the permanent magnets 147. These electromagnetic coils 151 are excited such that the polarities are alternately inverted. Likewise, on that lower surface of the slider 35, which opposes the permanent magnets 148, electromagnetic coils 152 are arranged along the running direction at the same intervals as the permanent magnets 148. These electromagnetic coils 152 are also so excited as to alternately invert the polarities.

These electromagnetic coils 151 and 152 are so controlled as to have polarities opposite to those of the opposing permanent magnets 147 and 148, as the slider 35 moves by traveling, by changing the exciting currents. Accordingly, the slider 35 floats in the traveling space 146 by the magnetic repulsive force between the permanent magnets 147 and the electromagnetic coils 151. In addition, the magnetic repulsive force and the phase change of polarity generate magnetic repulsive force and magnetic attractive force between the permanent magnets 147 and 148 and the electromagnetic coils 151 and 152 in the longitudinal direction of the fixed guide rail 121, thereby generating the thrust of the slider 35. Consequently, the slider 35 can be traveled in a non-contact state while being floating on the fixed guide rail 121. Since the traveling unit 33 runs in a non-contact state, the clean state in the clean room is not disturbed. This allows smooth running of the traveling unit 33.

Also, as shown in FIG. 22, rotatable wheels 153 and 154 are arranged on the two side surfaces and lower surface of the slider 35. While the slider 35 is traveling, these wheels 153 and 154 are not in contact with the fixed guide rail 21. When the excitation currents to the electromagnetic coils 151 and 152 are turned off while the slider 35 is at rest, the wheels 153 and 154 on the two side surfaces and lower surface of the slider 35 come in contact with the fixed guide rail 21 and support the slider 35. That is, when the slider 35 is at rest, it is possible to save energy by turning off the excitation currents to the electromagnetic coils 153 and 154 and fix the travelling unit 33 by supporting the slider 35 by the wheels 153 and 154.

Furthermore, on one side surface of the fixed guide rail 21, two power transmission lines 155 through which a high-frequency AC current flows are extended over the whole length of the fixed guide rail 21. An E-shaped core 156 is placed on the inner side surface of the cylindrical member 149. A pickup coil 157 is wound on this E-shaped core 156, and the power transmission lines 155 are arranged close to recesses of the E-shaped core 156. Crossing of an alternating magnetic field generated by the primary power transmission lines 155 and the pickup coil 157 wound on the E-shaped core 156 generates induced electromotive force by using the pickup coil 157 as a secondary winding. Accordingly, electric power can be supplied in a non-contact state from the power transmission lines 155 to the traveling unit 33. Compared to a movable power-supply cable or a contact type power supply system, this non-contact power supply system can minimize the production of duct because the system does not use any movable portions or contact portions. Consequently, the clean state in the clean room is not disturbed, so the cleanliness can be maintained with high accuracy.

Although not shown, the structure between the traveling guide rail 22 and the traveling member 23 is analogous to the structure between the fixed guide rail 21 and the traveling unit 33 of the traveling guide rail 22 herein explained.

(Third Embodiment)

Figure 23:
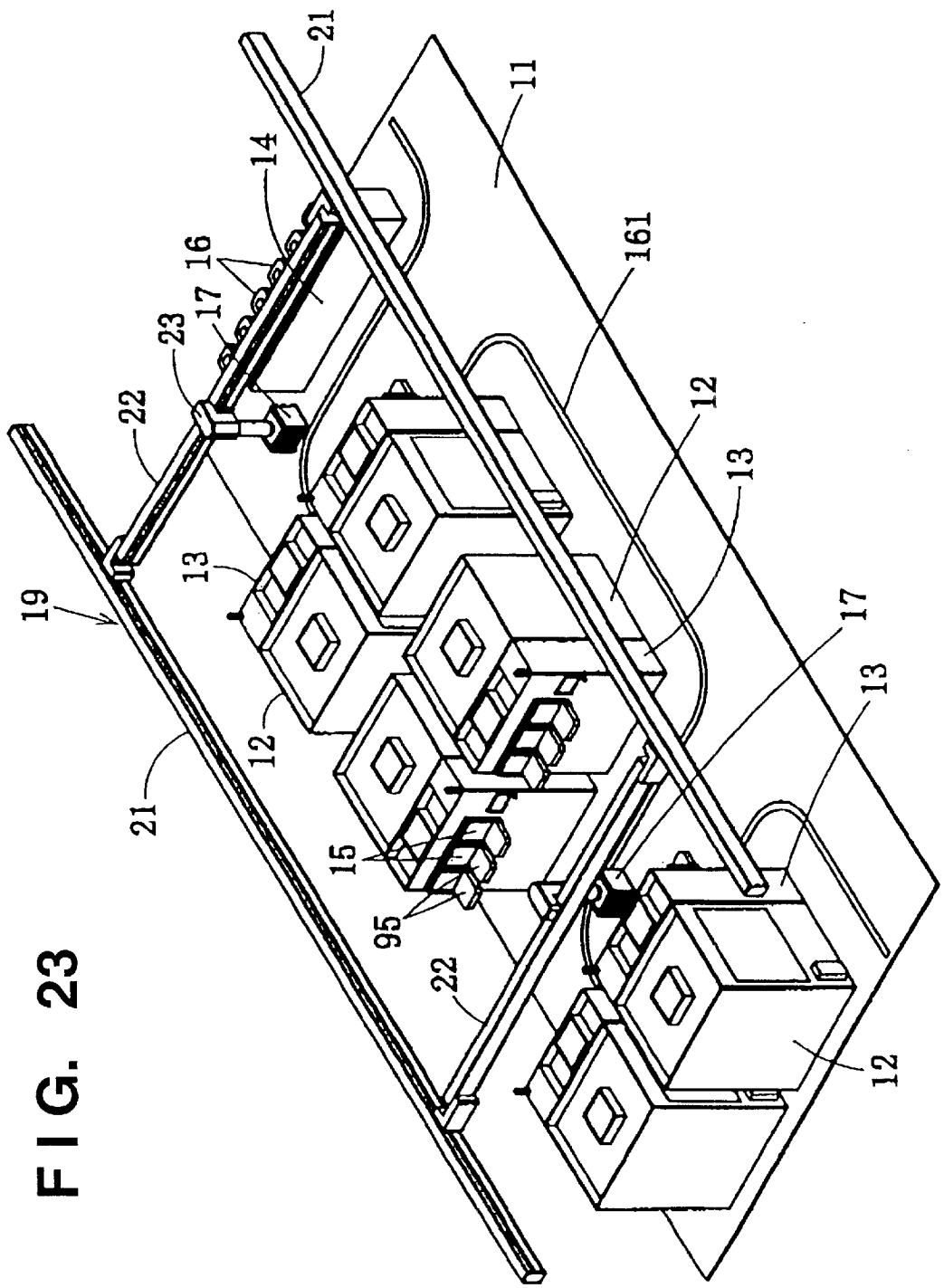
FIG. 23 is a perspective view showing the interior of a clean room including a work conveying system according to still another embodiment of the present invention.

FIG. 23 is a general perspective view showing the interior of a clean room using a work conveying system according to still another embodiment of the present invention. In this work conveying system, neither a work holder 17 nor an interface apparatus 13 have a work lifter. A traveling guide rail 22 which runs along fixed guide rails 21 and a traveling member 23 which runs along this traveling guide rail 22 constitute a horizontal moving mechanism 19. This horizontal moving mechanism 19 permits the work holder 17 to freely run in a two-dimensional space (in a horizontal plane). The work holder 17 is held at the same height as the upper surface (work loading/unloading ports 15) of a work table 95 of the interface apparatus 13. A controller controls the work holder 17 to run in a space between processing chambers 12 and the interface apparatuses 13 without interfering with them. However, if the height of the work loading/unloading ports 15 of the interface apparatus 13 has a difference due to an error or the like from the height of the work holder 17 and if this difference interferes with loading/unloading, the work holder 17 slightly moves up or down to adjust its height whenever loading/unloading works with respect to the interface apparatus 13. Therefore, this height correction allows smooth work loading/unloading without any steps within a short time period.

The traveling path of the work holder 17 can be prestored in the controller by teaching, or the controller can automatically determine the traveling path by inputting installation position data of the processing chambers 12 and the interface apparatuses 13. Alternatively, as shown in FIG. 23, the work holder 17 can move while optically detecting a reflection tape 161 pasted on a floor 11.

When a work lifting function is removed from the work conveying system as described above, the mechanism simplifies to make it possible to reduce the number of installation steps. This can also simplify control of the work conveying system, resulting in a low product cost. Furthermore, addition or change of the arrangement of the processing chambers 12 can be flexibly controlled by altering the settings of control software.

Figure 24:
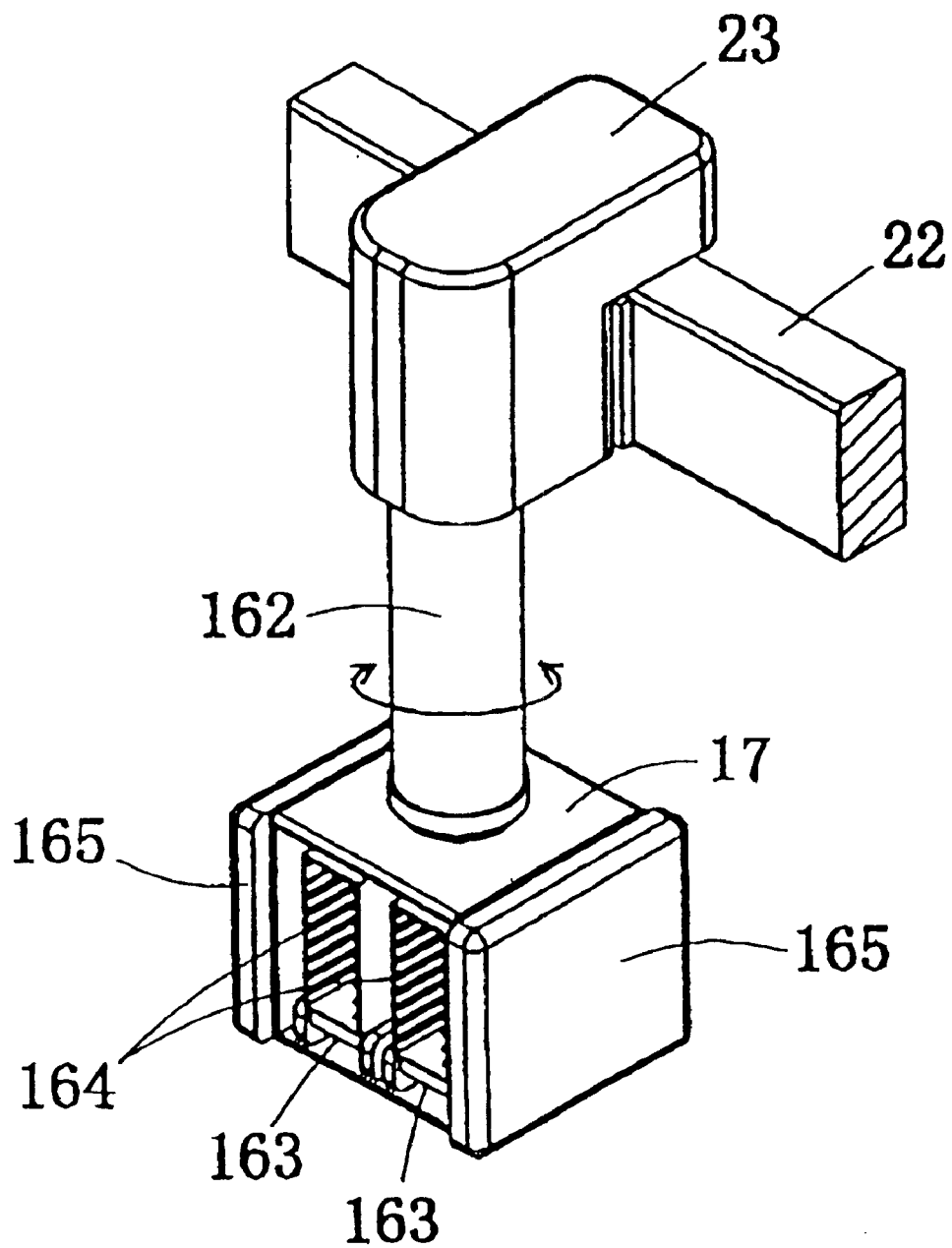
FIG. 24 is a perspective view showing a work holder used in the work conveying system shown in FIG. 23.

As shown in FIG. 24, the work holder 17 is a rack container and is suspended from the traveling member 23 by a cylindrical holding arm 162. This holding arm 162 moves up and down about 50 mm with respect to the traveling member 23, thereby finely adjusting the height of the work holder 17 as described above. This work holder 17 can rotate, although it does not vertically move (except when it is finely moved up or down by fine contraction or stretching of the holding arm). A conveyor device 163 is installed in this work holder 17 (work container) to allow smooth loading/unloading of works with respect to the interface apparatus 13. Racks 164 for mounting works are formed above the conveyor device 163 in the work holder 17. These racks 164 can solely load/unload works with respect to the interface apparatus 13.

Bumpers 165 having contact sensors (not shown) are attached to the right and left side surfaces of the work holder 17. When this bumper 165 comes in contact with the processing chamber 12 or the interface apparatus 13, the contact sensor senses the contact and stops the movement of the work holder 17 or detours the work holder 17. Accordingly, it is possible to prevent the work holder 17 from colliding against the processing chamber 12 or the interface apparatus 13 to thereby damage the work conveying system, the processing chamber 12, or the interface apparatus 13. Also, the work holder 17 stops when contacting some other obstacle to prevent damage to both.

(Fourth Embodiment)

Figure 26:
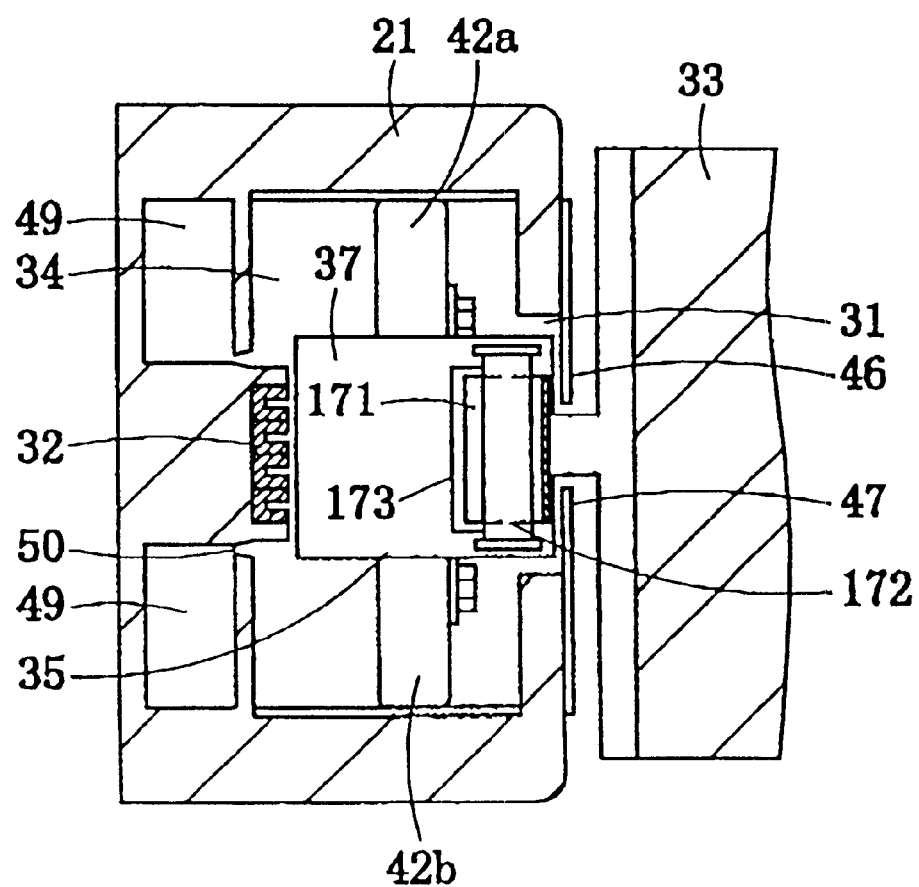
FIG. 26 is a sectional view of the fixed guide rail accommodating the slider.
Figure 27:
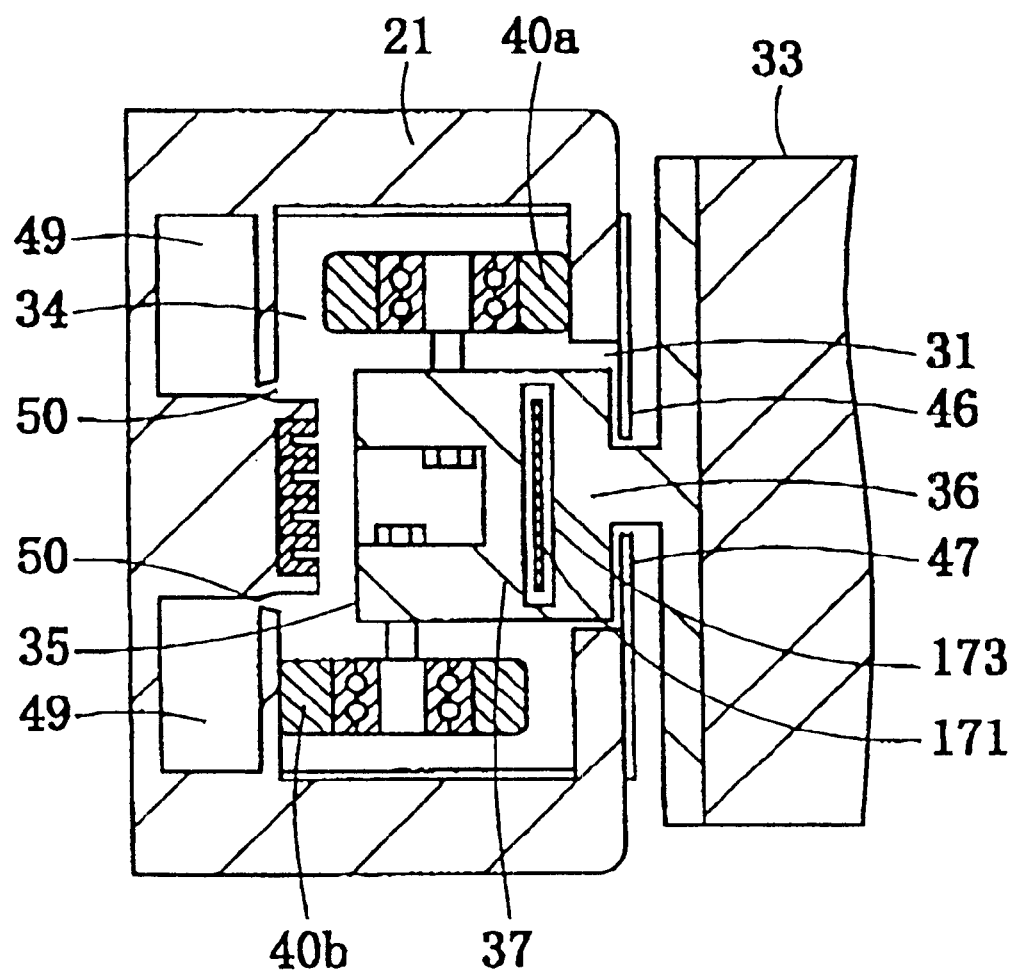
FIG. 27 is another sectional view of the fixed guide rail accommodating the slider.

FIG. 25A is a front view showing a fixed guide rail 21 and a traveling unit 33 according to still another embodiment of the present invention. FIG. 25B is a sectional view showing the fixed guide rail 21 by omitting the internal structure of a slider 35. FIGS. 26 and 27 are sectional views of the fixed guide rail 21. In this embodiment, flat shielding plates 46 and 47 protrude into a side opening 31 of the fixed guide rail 21 from the upper and lower edges, respectively, of the side opening 31. Inside the fixed guide rail 21, a belt-like flexible shielding member 171 is pasted over the entire length of the fixed guide rail 21 so as to cover the gap between the shielding plates 46 and 47. The two ends of the flexible shielding member 171 are fastened to the two ends of the fixed guide rail 21.

The front surface of the slider 35 also covers the gap between the shielding plates 46 and 47 in the vicinity of the gap. Rollers 172 are arranged at the two end portions of the slider 35. A through hole 173 for inserting the flexible shielding member 171 is formed in the slider 35 between these rollers 172. The flexible shielding member 171 disposed in the fixed guide rail 21 is inserted into this through hole 173 of the slider 35 via the rollers 172.

In this embodiment, therefore, the flexible shielding member 171 covers the gap between the shielding plates 46 and 47, thereby preventing dust produced in the fixed guide rail from being released into the clean room. Additionally, the slider 35 can move in the fixed guide rail 21 without interfering with shielding by the flexible shielding member 171 or without being interfered by the flexible shielding member 171.

As many apparently widely different embodiments of the present invention can be made without departing from the spirit and scope thereof, it is to be understood that the invention is not limited to the specific embodiments thereof except as defined in the appended claims.

What is claimed is:

1. A work transfer system for transferring work in a clean room, comprising:

a work holder for holding work, a guide rail; and a traveling unit traveling along said guide rail and supporting said work holder;

said guide rail having a traveling space in which a slider of said traveling unit is accommodated and moves, said guide rail further having a suction passage in communication with said traveling space for drawing dust produced in said traveling space therethrough.

2. The system according to claim 1, further comprising drawing means for drawing dust from said traveling space to outside of the clean room through said suction passage.

3. The system according to claim 1, further comprising a partition between said traveling space and said suction passage, wherein said partition has openings for communicating said traveling space and said suction passage at predetermined intervals.

4. A work transfer system for transferring work in a clean room, comprising:

a work holder for holding work, a pair of horizontal fixed guide rails disposed parallel to each other, at least one horizontal traveling guide rail extending between said fixed guide rails and traveling along said fixed guide rails, and a traveling unit traveling along said traveling guide rail and supporting said work holder, each of said fixed guide rails having a first traveling space in which a slider of said traveling guide rail is accommodated and moves and a first suction passage in communication with said first traveling space for drawing dust produced in said first traveling space therethrough, said traveling guide rail having a second traveling space in which a slider of said traveling unit is accommodated and moves and a second passage in communication with said second traveling space for drawing dust produced in said second traveling space through said first and second suction passages.

5. The system according to claim 4, further comprising a drawing means provided between said fixed guide rail and said traveling guide rail for drawing dust from said second suction passage to said first suction passage or said first traveling space.

* * * * *

UNITED STATES PATENT AND TRADEMARK OFFICE
CERTIFICATE OF CORRECTION

PATENT NO. : 6,604,624 B2
DATED : August 12, 2003
INVENTOR(S) : Yasunari Hirata et al.

It is certified that error appears in the above-identified patent and that said Letters Patent is hereby corrected as shown below:

Title Page,
Item [30], Foreign Application Priority Data, delete "Sep. 22, 1998 (JP) 10-250836"
Item [56], References Cited, FOREIGN PATENT DOCUMENTS,
add -- JPA 10-250836 9/1998 --.

Signed and Sealed this

Twenty-ninth Day of June, 2004

JON W. DUDAS
*Acting Director of the United States Patent and Trademark Office*